(12) United States Patent
Enya et al.

(10) Patent No.: US 8,483,251 B2
(45) Date of Patent: Jul. 9, 2013

(54) GROUP III NITRIDE SEMICONDUCTOR LASER DIODE, AND METHOD FOR PRODUCING GROUP III NITRIDE SEMICONDUCTOR LASER DIODE

(75) Inventors: Yohei Enya, Itami (JP); Yusuke Yoshizumi, Itami (JP); Takashi Kyono, Itami (JP); Katsushi Akita, Itami (JP); Masaki Ueno, Itami (JP); Takamichi Sumitomo, Itami (JP); Takao Nakamura, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/294,378

(22) Filed: Nov. 11, 2011

(65) Prior Publication Data

US 2012/0114002 A1    May 10, 2012

Related U.S. Application Data

(63) Continuation of application No. PCT/JP2010/053116, filed on Feb. 26, 2010.

(30) Foreign Application Priority Data

May 11, 2009  (JP) ............................... P2009-114886

(51) Int. Cl.
*H01S 5/00*    (2006.01)
(52) U.S. Cl.
USPC ............... 372/44.011; 372/43.01; 372/45.01; 372/46.01

(58) Field of Classification Search
USPC ................... 372/43.1, 45.011, 43.01, 44.011, 372/45.01, 46.01
See application file for complete search history.

(56) References Cited

U.S. PATENT DOCUMENTS

2006/0097353 A1    5/2006  Motoki et al.
2008/0285609 A1*  11/2008  Ohta et al. ............... 372/44.011

FOREIGN PATENT DOCUMENTS

| JP | 2000-044400 | 2/2000 |
| JP | 2001-024285 | 1/2001 |
| JP | 2002-373864 | 12/2002 |
| JP | 2008-034658 | 2/2008 |
| JP | 2008-044842 | 2/2008 |
| JP | 2008-277539 | 11/2008 |
| JP | 2008-311640 | 12/2008 |

* cited by examiner

*Primary Examiner* — Jessica Stultz
*Assistant Examiner* — Phillip Nguyen
(74) *Attorney, Agent, or Firm* — Venable LLP; Michael A. Sartori; Tamatane J. Aga

(57) ABSTRACT

Provided is a Group III nitride semiconductor laser diode with a cladding layer capable of providing high optical confinement and carrier confinement. An n-type $Al_{0.08}Ga_{0.92}N$ cladding layer is grown so as to be lattice-relaxed on a (20-21)-plane GaN substrate. A GaN optical guiding layer is grown so as to be lattice-relaxed on the n-type cladding layer. An active layer, a GaN optical guiding layer, an $Al_{0.12}Ga_{0.88}N$ electron blocking layer, and a GaN optical guiding layer are grown so as not to be lattice-relaxed on the optical guiding layer. A p-type $Al_{0.08}Ga_{0.92}N$ cladding layer is grown so as to be lattice-relaxed on the optical guiding layer. A p-type GaN contact layer is grown so as not to be lattice-relaxed on the p-type cladding layer, to produce a semiconductor laser. Dislocation densities at junctions are larger than those at the other junctions.

24 Claims, 11 Drawing Sheets

(a)

(b)

GROUP III NITRIDE SEMICONDUCTOR LASER DIODE, AND METHOD FOR PRODUCING GROUP III NITRIDE SEMICONDUCTOR LASER DIODE

CROSS REFERENCE TO RELATED APPLICATIONS

This is a continuation of PCT application No. PCT/JP2010/053116filed on Feb. 26, 2010, claiming the benefit of priorities from Japanese Patent application No. 2009-114886 filed on May 11, 2009.

TECHNICAL FIELD

The present invention relates to a Group III nitride semiconductor laser diode, and a method for fabricating the Group III nitride semiconductor laser diode.

BACKGROUND ART

Patent Literature 1 discloses the nitride semiconductor light emitting device in which an epitaxial layer structure containing AlGaN is less likely to crack. This nitride semiconductor light emitting device includes a support body comprised of a GaN semiconductor, a first conductivity type AlGaN region, a second conductivity type GaN semiconductor layer, and an active layer. Since the c-axis of the GaN semiconductor of the support body extends from one side face to the other side face, the primary surface of the substrate is substantially an m-plane or an a-plane. The AlGaN region and GaN semiconductor layer are provided on the primary surface of the support body. The aluminum composition of the AlGaN region is not less than 0.05 and the thickness D1 of the AlGaN region is not less than 500 nm. The active layer is provided between the first conductivity type AlGaN region and the second conductivity type GaN semiconductor layer.

CITATION LIST

Patent Literature

Patent Literature 1: Japanese Patent Application Laid-open No. 2008-277539

SUMMARY OF INVENTION

Technical Problem

In most of gallium nitride laser diodes, a cladding layer is grown on a gallium nitride semiconductor region like c-plane GaN. This cladding layer functions to provide optical confinement and carrier confinement. The composition and thickness of the cladding layer are designed so as to achieve desired optical confinement and carrier confinement. For this reason, the bandgap and refractive index of the cladding layer are made different from those of underlying GaN. Hence, the lattice constant of the semiconductor material of the cladding layer is made different from that of GaN, and the cladding layer comes to incorporate strain depending upon the lattice constants of these materials. The lattice constant difference between the gallium nitride based semiconductor region and the cladding layer causes strain in the well layer.

It is an object of the present invention to provide a Group III nitride semiconductor laser diode having a cladding layer capable of providing high optical confinement and carrier confinement, and it is another object of the present invention to provide a method for fabricating the Group III nitride semiconductor laser diode.

Solution to Problem

A first aspect of the present invention relates to a Group III nitride semiconductor laser diode. This laser diode comprises: (a) a first conductivity type cladding layer provided on a primary surface of a semiconductor region, the semiconductor region comprising a first hexagonal Group III nitride semiconductor, and the first conductivity type cladding layer comprising a second hexagonal Group III nitride semiconductor; (b) a first optical guiding layer provided on the first conductivity type cladding layer and comprising a third hexagonal Group III nitride semiconductor; (c) a carrier blocking layer comprising a fourth hexagonal Group III nitride semiconductor; and (d) an active layer provided between the first conductivity type cladding layer and the carrier blocking layer. The primary surface of the semiconductor region makes an angle of not less than 10 degrees with respect to a reference plane perpendicular to the c-axis of the first hexagonal Group III nitride semiconductor; the first conductivity type cladding layer is lattice-relaxed on the primary surface of the semiconductor region; the first conductivity type cladding layer, the first optical guiding layer, the active layer, and the carrier blocking layer are arranged in a direction of a normal axis to the primary surface of the semiconductor region; the carrier blocking layer incorporates strain and the active layer comprises a semiconductor layer incorporating strain; the first optical guiding layer is lattice-relaxed on a primary surface of the first conductivity type cladding layer; the primary surface of the semiconductor region has either of nonpolar character or semipolar character; and the first conductivity type cladding layer is lattice-relaxed on the primary surface of the semiconductor region.

In this laser diode, since the primary surface of the semiconductor region makes the angle of not less than 10 degrees with respect to the reference plane perpendicular to the c-axis, the c-axis of the first conductivity type cladding layer makes a non-zero angle with respect to the primary surface of the semiconductor region. Accordingly, the first conductivity type cladding layer can be made lattice-relaxed on the primary surface of the semiconductor region. This lattice relaxation permits the second hexagonal Group III nitride semiconductor of the first conductivity type cladding layer to have the composition and thickness resulting from a desired clad characteristic. Since the first optical guiding layer is provided on the primary surface of the first conductivity type cladding layer, the c-axis of the first optical guiding layer makes a non-zero angle with respect to the primary surface of the semiconductor region, so that the first optical guiding layer can be made lattice-relaxed on the primary surface of the first conductivity type cladding layer. Owing to this lattice relaxation, it is feasible to reduce restrictions on the composition and thickness of the third hexagonal Group III nitride semiconductor of the first optical guiding layer imposed by the composition of the first conductivity type cladding layer. Furthermore, since the active layer and carrier blocking layer are provided on this first optical guiding layer, it is feasible to reduce restrictions on the strain of the active layer imposed by the composition of the semiconductor supporting the first optical guiding layer. Since the thicknesses of the active layer and the carrier blocking layer are sufficiently small, these layers are not lattice-relaxed.

In the laser diode according to the first aspect of the present invention, a direction of the c-axis and a magnitude of a lattice constant d1 in the direction of the c-axis in the first hexagonal Group III nitride semiconductor are represented by a lattice vector LVC1. A direction of the c-axis and a magnitude of a lattice constant d2 in the direction of the c-axis in the second hexagonal Group III nitride semiconductor are represented by a lattice vector LVC2; the lattice vector LVC1 consists of a longitudinal component $V1_L$ in the direction of the normal axis and a transverse component $V1_T$ perpendicular to the longitudinal component; the lattice vector LVC2 consists of a longitudinal component $V2_L$ in the direction of the normal axis and a transverse component $V2_T$ perpendicular to the longitudinal component; and the transverse component $V1_T$ is different from the transverse component $V2_T$.

In this laser diode, since the transverse component $V1_T$ in the first hexagonal Group III nitride semiconductor is different from the transverse component $V2_T$ in the second hexagonal Group III nitride semiconductor, strain due to the lattice constant difference between the first and second hexagonal Group III nitride semiconductors is reduced in the first conductivity type cladding layer.

In the laser diode according to the first aspect of the present invention, a direction of a c-axis in the third hexagonal Group III nitride semiconductor and a magnitude of a lattice constant d3 in the direction of the c-axis thereof are represented by a lattice vector LVC3; the lattice vector LVC3 includes a longitudinal component $V3_L$ in the direction of the normal axis and a transverse component $V3_T$ perpendicular to the longitudinal component; and the transverse component $V2_T$ is different from the transverse component $V3_T$.

In this laser diode, since the transverse component $V2_T$ in the second hexagonal Group III nitride semiconductor is different from the transverse component $V3_T$ in the third hexagonal Group III nitride semiconductor, strain due to the lattice constant difference between the second and third hexagonal Group III nitride semiconductors is reduced in the first optical guiding layer.

The laser diode according to the first aspect of the present invention preferably further comprises a second conductivity type cladding layer which comprises a fifth hexagonal Group III nitride semiconductor and is provided on the carrier blocking layer. The carrier block layer is provided between the second conductivity type cladding layer and the active layer; the fifth hexagonal Group III nitride semiconductor is different from the third hexagonal Group III nitride semiconductor; and the second conductivity type cladding layer is lattice-relaxed.

In this laser diode, since the second conductivity type cladding layer is provided on the primary surface of the semiconductor region, the c-axis of the second conductivity type cladding layer makes a non-zero angle with respect to the primary surface of the semiconductor region, so that the second conductivity type cladding layer can be made lattice-relaxed. Owing to this lattice relaxation, it is feasible to ease restrictions on ranges of composition and thickness applicable to the second conductivity type cladding layer, which are imposed by the difference between the lattice constant of the second conductivity type cladding layer and the lattice constant of the underlying semiconductor region.

The laser diode according to the first aspect of the present invention preferably further comprises: a second optical guiding layer provided between the second conductivity type cladding layer and the active layer and comprised of a sixth hexagonal Group III nitride semiconductor. The lattice relaxation of the second conductivity type cladding layer takes place on the second optical guiding layer.

In this laser diode, since the second optical guiding layer is provided through the active layer on a primary surface of the first optical guiding layer, the second optical guiding layer incorporates low strain. For this reason, the second optical guiding layer can be kept from being lattice-relaxed. The lattice relaxation of the second conductivity type cladding layer occurs on the second optical guiding layer.

In the laser diode according to the first aspect of the present invention, preferably, the second conductivity type cladding layer comprises $In_{X2}Al_{Y2}Ga_{1-X2-Y2}N$ ($0 \leq X2 \leq 0.50$, $0 \leq Y2 \leq 0.50$).

In this laser diode, the second conductivity type cladding layer may be made of GaN or AlGaN or InAlGaN.

In the laser diode according to the first aspect of the present invention, preferably, a thickness of the second conductivity type cladding layer is not less than 300 nm.

In this laser diode, the second conductivity type cladding layer provides desired optical confinement and has the thickness enough for lattice relaxation.

In the laser diode according to the first aspect of the present invention, preferably, the first conductivity type cladding layer may made of $In_{X1}Al_{Y1}Ga_{1-X1-Y1}N$ ($0 \leq X1 \leq 0.50$, $0 \leq Y1 \leq 0.50$).

In this laser diode, the first conductivity type cladding layer may be made of GaN or AlGaN or InAlGaN.

In the laser diode according to the first aspect of the present invention, preferably, a thickness of the first conductivity type cladding layer is not less than 300 nm.

In this laser diode, the first conductivity type cladding layer provides desired optical confinement and has the thickness enough for lattice relaxation.

In the laser diode according to the first aspect of the present invention, preferably, the active layer may comprise $In_U Al_V Ga_{1-U-V}N$ ($0 \leq U \leq 0.50$, $0 \leq V \leq 0.50$).

In this laser diode, the active layer can include semiconductor layers comprising gallium nitride based semiconductors of various compositions.

In the laser diode according to the first aspect of the present invention, preferably, an emission wavelength of the active layer is not less than 250 nm and not more than 600 nm.

In this laser diode, the active layer can emit light in a variety of wavelength bands.

In the laser diode according to the first aspect of the present invention, preferably, the first optical guiding layer may be made of $In_S Al_T Ga_{1-S-T}N$ ($0 \leq S \leq 0.30$, $0 \leq T \leq 0.30$).

In this laser diode, the first guide layer can be comprised of GaN, InGaN, InAlGaN, or the like.

In the laser diode according to the first aspect of the present invention, preferably, the sum of a thickness of the active layer and a thickness of the first optical guiding layer is not less than 200 nm.

In this laser diode, the optical waveguide of the active layer and the first optical guiding layer can propagate light in a variety of wavelength bands.

In the laser diode according to the first aspect of the present invention, preferably, dislocations at an interface between the first conductivity type cladding layer and the first optical guiding layer have a density of not less than $1 \times 10^8$ cm$^{-2}$.

In this laser diode, a slip plane is generated by slip of a c-plane or the like due to the configuration in which the c-axis makes the non-zero angle with the normal axis. Because of the generation of this slip plane, dislocations are generated at the foregoing interface. Since the dislocation density is not less than $1 \times 10^8$ cm$^{-2}$, the first conductivity type cladding layer includes the slip plane at the density enough for occurrence of lattice relaxation in the first optical guiding layer, at the interface to the first optical guiding layer.

In the laser diode according to the first aspect of the present invention, preferably, the dislocations include components of edge dislocations.

In this laser diode, the strain due to the lattice constant difference can be relaxed by introduction of the edge dislocations.

The laser diode according to the first aspect of the present invention preferably further comprises: a support body having a primary surface that is either of nonpolar or semipolar. The first conductivity type cladding layer is provided on the primary surface of the support body; and the primary surface that is either of nonpolar or semipolar provides the primary surface of the semiconductor region comprised of the first hexagonal Group III nitride semiconductor.

In this laser diode, the lattice relaxation of the semiconductor can be caused according to a given condition by use of the support body with the primary surface that is either of nonpolar or semipolar. The polarity that is either of nonpolar or semipolar is either of semipolar character and nonpolar character.

In the laser diode according to the first aspect of the present invention, preferably, the support body may be made of $Al_ZGa_{1-Z}N$ ($0 \leqq Z \leqq 1$).

In this laser diode, it is feasible to securely implement not only generation of lattice relaxation of the semiconductor but also growth of Group III nitrides with excellent crystal quality.

In the laser diode according to the first aspect of the present invention, preferably, the support body may be made of GaN. In the laser diode according to the first aspect of the present invention, preferably, the support body may be made of AlGaN. Furthermore, in the laser diode according to the first aspect of the present invention, preferably, the support body may be made of AlN.

A second aspect of the present invention is a method for fabricating a Group III nitride semiconductor laser diode. This method comprises the steps of (a) growing a first conductivity type cladding layer on a primary surface of a semiconductor region so that the first conductivity type cladding layer is lattice-relaxed, the semiconductor region comprising a first hexagonal Group III nitride semiconductor, and the first conductivity type cladding layer comprising a second hexagonal Group III nitride semiconductor; (b) growing a first optical guiding layer on the first conductivity type cladding layer so that the first optical guiding layer is lattice-relaxed, the first optical guiding layer comprising a third hexagonal Group III nitride semiconductor; (c) growing an active layer on the first optical guiding layer; and (d) growing a carrier blocking layer on the active layer, the carrier blocking layer comprising a fourth hexagonal Group III nitride semiconductor. The primary surface of the semiconductor region makes an angle of not less than 10 degrees with respect to a reference plane perpendicular to the c-axis of the first hexagonal Group III nitride semiconductor; the primary surface of the semiconductor region has either of nonpolar character and semipolar character; the carrier blocking layer incorporates strain; and the active layer comprises a semiconductor layer and the semiconductor layer incorporating strain.

In this method, since the primary surface of the semiconductor region makes the angle of not less than 10 degrees with respect to the reference plane perpendicular to the c-axis of the first hexagonal Group III nitride semiconductor, the c-axis of the first conductivity type cladding layer makes a non-zero angle with respect to the primary surface of the semiconductor region. For this reason, the second hexagonal Group III nitride semiconductor can be grown so that the first conductivity type cladding layer is lattice-relaxed on the primary surface of the semiconductor region. Owing to this lattice relaxation, the second hexagonal Group III nitride semiconductor of the first conductivity type cladding layer can be provided with the composition and thickness according to a desired clad characteristic. Since the first optical guiding layer is provided on a primary surface of the first conductivity type cladding layer, the c-axis of the first optical guiding layer makes a non-zero angle with respect to the primary surface of the semiconductor region. For this reason, the third hexagonal Group III nitride semiconductor can be grown so that the first optical guiding layer is lattice-relaxed on the primary surface of the first conductivity type cladding layer. Owing to this lattice relaxation, it is feasible to reduce restrictions on the composition and thickness of the third hexagonal Group III nitride semiconductor of the first optical guiding layer imposed by the composition of the first conductivity type cladding layer. Furthermore, since the active layer and carrier blocking layer are provided on this first optical guiding layer, it is feasible to reduce restrictions on the strain of the active layer and the carrier blocking layer imposed by the composition of the semiconductor supporting the first optical guiding layer. On the other hand, since the thickness of the active layer is smaller than the critical thickness thereof, the active layer can be grown without occurrence of lattice relaxation. Since the thickness of the carrier blocking layer is smaller than the critical thickness thereof, the carrier blocking layer can be grown without occurrence of lattice relaxation.

In the method according to the second aspect of the present invention, the first conductivity type cladding layer can comprise $In_{X1}Al_{Y1}Ga_{1-X1-Y1}N$ ($0 \leqq X1 \leqq 0.50$, $0 \leqq Y1 \leqq 0.50$), and a thickness of the first conductivity type cladding layer can be not less than 300 nm.

In this method, the first conductivity type cladding layer may be made of GaN or AlGaN or InAlGaN, and $In_{X1}Al_{Y1}Ga_{1-X1-Y1}N$ provides desired optical confinement and has the thickness enough for lattice relaxation.

The method according to the second aspect of the present invention preferably further comprises the step of: growing a second conductivity type cladding layer, which comprises a fifth hexagonal Group III nitride semiconductor, on the carrier blocking layer so that the second conductivity type cladding layer is lattice-relaxed. The fifth hexagonal Group III nitride semiconductor is different from the third hexagonal Group III nitride semiconductor. The second conductivity type cladding layer is lattice-relaxed.

In this method, since the second conductivity type cladding layer is provided on the primary surface of the semiconductor region, the c-axis of the second conductivity type cladding layer makes a non-zero angle with respect to the primary surface of the semiconductor region. For this reason, the second conductivity type cladding layer can be grown so as to be lattice-relaxed. Owing to this lattice relaxation, it is feasible to ease restrictions, which are imposed by the difference between the lattice constant of the second conductivity type cladding layer and the lattice constant of the underlying semiconductor region, on ranges of composition and thickness applicable to the second conductivity type cladding layer.

In the method according to the second aspect of the present invention, preferably, the second conductivity type cladding layer may be made of AlGaN or InAlGaN, A thickness of the second conductivity type cladding layer is larger than a critical thickness in an aluminum composition and an indium composition of the fifth hexagonal Group III nitride semiconductor.

In this method, it becomes easier to cause lattice relaxation in the second conductivity type cladding layer.

The method according to the second aspect of the present invention preferably further comprises the step of, prior to growth of the second conductivity type cladding layer, growing a second optical guiding layer, which comprises a sixth hexagonal Group III nitride semiconductor, on the active layer so that the sixth hexagonal Group III nitride semiconductor of the second optical guiding layer is not lattice-relaxed. The lattice relaxation of the second conductivity type cladding layer occurs on the second optical guiding layer.

In this method, since the second optical guiding layer is provided through the active layer on a primary surface of the first optical guiding layer, the second optical guiding layer incorporates low strain. For this reason, the second optical guiding layer can be grown so as not to be lattice-relaxed. The lattice relaxation of the second conductivity type cladding layer occurs on the second optical guiding layer.

In the method according to the second aspect of the present invention, preferably, the second optical guiding layer may be comprised of InGaN. A thickness of the second optical guiding layer is larger than a critical thickness in an indium composition of the sixth hexagonal Group III nitride semiconductor.

In this method, it becomes easier to cause lattice relaxation in the second optical guiding layer on the second conductivity type cladding layer.

In the method according to the second aspect of the present invention, preferably, the first conductivity type cladding layer may be made of AlGaN or InAlGaN. A thickness of the first conductivity type cladding layer is larger than a critical thickness in an aluminum composition and an indium composition of the second hexagonal Group III nitride semiconductor.

In the method according to the second aspect of the present invention, preferably, the first optical guiding layer may be made of InGaN. A thickness of the first optical guiding layer is larger than a critical thickness in an indium composition of the third hexagonal Group III nitride semiconductor.

In this method, it becomes easier to cause lattice relaxation in the first optical guiding layer on the first conductivity type cladding layer.

The method according to the second aspect of the present invention preferably further comprises the step of preparing a substrate with a primary surface, which is either of nonpolar or semipolar, comprising the first hexagonal Group III nitride semiconductor. The primary surface of the semiconductor region is provided by the primary surface that is either of nonpolar or semipolar, and the substrate may be made of any one of GaN, AlGaN and AlN.

In this method, the lattice relaxation of the semiconductor can be caused according to a given condition, using the support body with the primary surface that is either of nonpolar or semipolar, and it becomes feasible to securely implement not only the generation of lattice relaxation of the semiconductor but also the growth of Group III nitrides with excellent crystal quality.

The above objects and other objects, features, and advantages of the present invention will more readily become clear from the following detailed description of the preferred embodiments of the present invention proceeding with reference to the accompanying drawings.

Advantageous Effects of Invention

As described above, the present invention can provide the Group III nitride semiconductor laser diode having the cladding layer capable of providing high optical confinement and carrier confinement and also provide the method for fabricating this Group III nitride semiconductor laser diode.

DESCRIPTION OF EMBODIMENTS

The expertise of the present invention can be readily understood in view of the following detailed description with reference to the accompanying drawings presented by way of illustration. The below will describe embodiments of the Group III nitride semiconductor laser diode, epitaxial substrate for the Group III nitride semiconductor laser diode, and method for producing the epitaxial substrate and Group III nitride semiconductor laser diode, with reference to the accompanying drawings. The same portions will be denoted by the same reference signs as much as possible.

Figure 1:
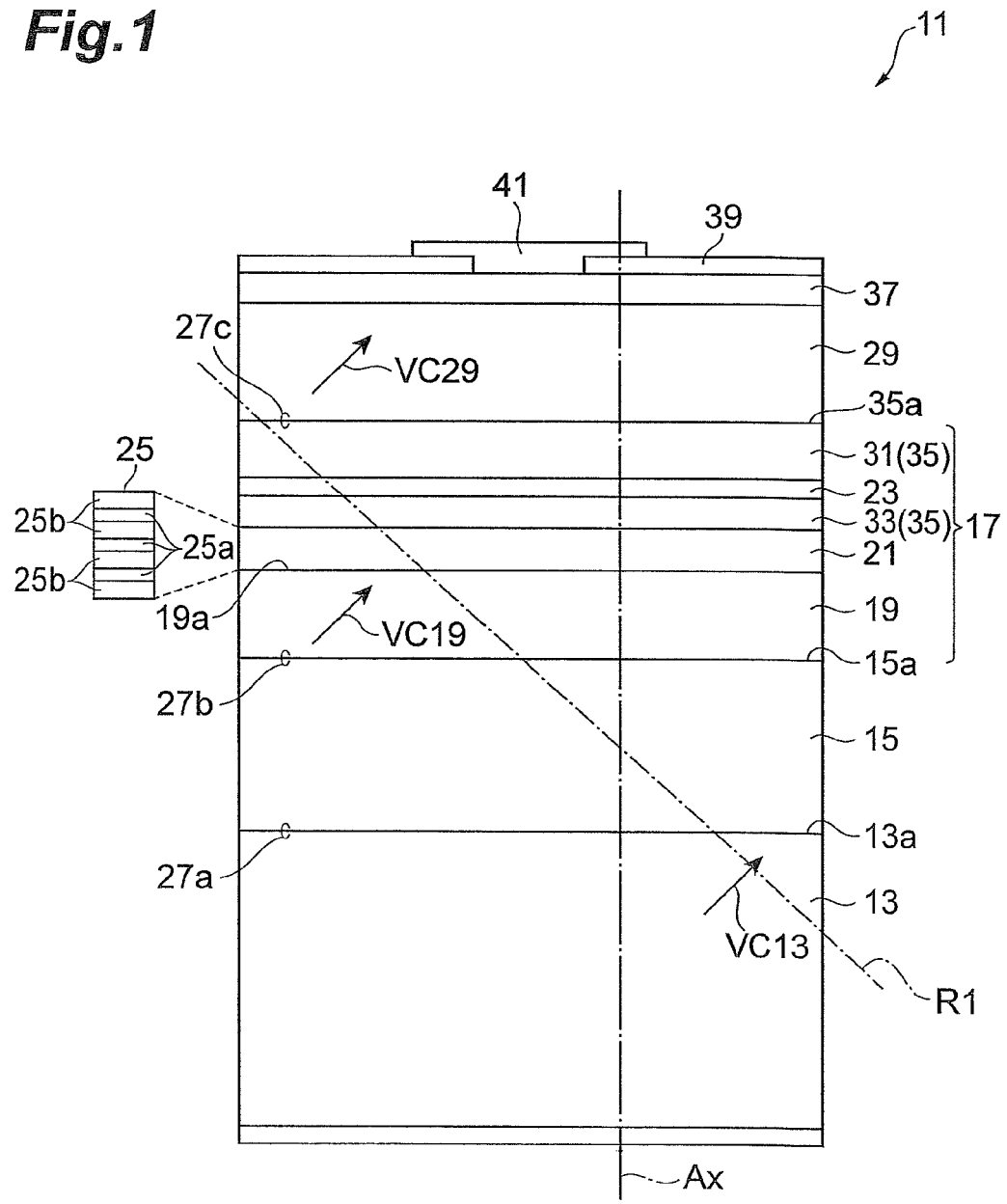
FIG. 1 is a drawing schematically showing a Group III nitride semiconductor laser diode according to an embodiment of the present invention.

FIG. 1 is a drawing schematically showing a Group III nitride semiconductor laser diode according to an embodiment of the present invention. The Group III nitride semiconductor laser diode (which will be referred to hereinafter as "laser diode") 11 is provided with a first conductivity type cladding layer 15 and a core semiconductor region 17. The core semiconductor region 17 includes a first optical guiding layer 19, an active layer 21, and a carrier blocking layer 23. A primary surface 13a of a semiconductor region 13 comprises a first hexagonal Group III nitride semiconductor and exhibits either of nonpolar character and semipolar character. The first hexagonal Group III nitride semiconductor preferably comprises for example, a gallium nitride based semiconductor, such as GaN. The first conductivity type cladding layer 15 comprises a second hexagonal Group III nitride semiconductor and is provided on the primary surface 13a of the semiconductor region 13. The second hexagonal Group III nitride semiconductor preferably comprises, for example, a gallium nitride based semiconductor. The first optical guiding layer 19 comprises a third hexagonal Group III nitride semiconductor and is provided between the first conductivity type cladding layer 15 and the active layer 21. The third hexagonal Group III nitride semiconductor preferably comprises, for example, a gallium nitride based semiconductor. The carrier blocking layer 23 comprises a fourth hexagonal Group III nitride semiconductor. The fourth hexagonal Group III nitride semiconductor preferably comprises, for example, a gallium nitride based semiconductor, such as AlGaN or InAlGaN. The active layer 21 is provided between the first conductivity type cladding layer 15 and the carrier blocking layer 23. The first conductivity type cladding layer 15, the first optical guiding layer 19, the active layer 21, and the carrier blocking layer 23 are arranged in order in a direction of a normal axis Ax to the primary surface 13a of the semiconductor region 13.

The primary surface 13a of the semiconductor region 13 makes an angle of not less than 10 degrees with respect to a reference plane R1, and the reference plane R1 is perpendicular to the c-axis of the first hexagonal Group III nitride semiconductor (which is represented by a c-axis vector "VC13"). The primary surface 13a can make an angle of not more than 170 degrees with respect to the reference plane R1. The first conductivity type cladding layer 15 is lattice-relaxed on the primary surface 13a. The carrier blocking layer 23 incorporates strain. The active layer 21 includes semiconductor layers 25a incorporating strain. The first optical guiding layer 19 is lattice-relaxed on a primary surface 15a of the first conductivity type cladding layer 15 and the primary surface 15a makes an angle of not less than 10 degrees with respect to the reference plane R1. The primary surface 15a can make an angle of not more than 170 degrees with respect to the reference plane R1.

In this laser diode 11, since the primary surface 13a of the semiconductor region 13 makes the angle of not less than 10 degrees with respect to the reference plane R1, the c-axis of the first conductivity type cladding layer 15 is inclined with respect to the primary surface 13a of the semiconductor region 13. Accordingly, the first conductivity type cladding layer 15 can be made lattice-relaxed on the primary surface 13a of the semiconductor region 13. This lattice relaxation allows the second hexagonal Group III nitride semiconductor of the first conductivity type cladding layer 15 to have the composition and thickness according to a desired clad characteristic. Since the first optical guiding layer 19 is provided on the primary surface 15a of the first conductivity type cladding layer 15, the c-axis of the first optical guiding layer 19 (c-axis vector VC19) is inclined with respect to the primary surface 13a of the semiconductor region 13. Accordingly, the first optical guiding layer 19 can be made lattice-relaxed on the primary surface 15a of the first conductivity type cladding layer 15. This lattice relaxation can reduce restrictions on the composition and thickness of the third hexagonal Group III nitride semiconductor of the first optical guiding layer 19 imposed by the composition of the first conductivity type cladding layer 15. Furthermore, since the active layer 21 and carrier blocking layer 23 are provided on this first optical guide layer 19, it is feasible to reduce restrictions on strain of the active layer 21 and the carrier block layer 23 imposed by the composition of the semiconductor supporting the first optical guiding layer 19. On the other hand, since the active layer 21 and the carrier blocking layer 23 are sufficiently thin, these layers 21, 23 undergo no lattice relaxation.

The first hexagonal Group III nitride semiconductor is different from the second hexagonal Group III nitride semiconductor, and the lattice constant of the first conductivity type cladding layer 15 is the same as that intrinsic to the second hexagonal Group III nitride semiconductor (lattice constant of an unstrained lattice), or is close to this intrinsic lattice constant. The second hexagonal Group III nitride semiconductor is different from the third hexagonal Group III nitride semiconductor, and the lattice constant of the first optical guiding layer 19 is the same as that intrinsic to the third hexagonal Group III nitride semiconductor, or is close to this intrinsic lattice constant. The bandgap of the second hexagonal Group III nitride semiconductor is larger than that of the third hexagonal Group III nitride semiconductor and the refractive index of the second hexagonal Group III nitride semiconductor is smaller than that of the third hexagonal Group III nitride semiconductor.

The first conductivity type cladding layer 15 can comprise GaN or AlGaN or InAlGaN. This first conductivity type cladding layer 15 preferably comprises $In_{X1}Al_{Y1}Ga_{1-X1-Y1}N$ ($0 \leq X1 \leq 0.50$, $0 \leq Y1 \leq 0.50$). The thickness of the first conductivity type cladding layer 15 is preferably not less than 300 nm. This first conductivity type cladding layer 15 provides desired optical confinement and has the thickness enough for lattice relaxation.

The semiconductor layers 25a of the active layer 21 include incorporated strain associated with the lattice constant of the first optical guiding layer 19. The lattice constant of the carrier blocking layer 23 is different from the lattice constant intrinsic to the fourth hexagonal Group III nitride semiconductor, and the carrier blocking layer 23 includes incorporated strain associated with the lattice constant of the first optical guiding layer 19. On the other hand, the first conductivity type cladding layer 15 is lattice-relaxed and therefore includes no incorporated strain due to the lattice constant difference between the lattice constant of the first hexagonal Group III nitride semiconductor and the lattice constant of the second hexagonal Group III nitride semiconductor, or its strain can be reduced. Since the first optical guiding layer 19 is lattice-relaxed, it includes no incorporated strain due to the lattice constant difference between the lattice constant of the second hexagonal Group III nitride semiconductor and the lattice constant of the third hexagonal Group III nitride semiconductor, or the strain can be reduced.

The active layer 21 preferably comprises $In_UAl_VGa_{1-U-V}N$ ($0 \leq U \leq 0.50$, $0 \leq V \leq 0.50$). In this laser diode 11, the active layer 21 can include semiconductor layers of gallium nitride based semiconductors of various compositions. The active layer 21 preferably has, for example, a quantum well structure 25. The quantum well structure 25 includes semiconductor layers 25a and barrier layers 25b. The semiconductor layers 25a serve as well layers, and the barrier layers 25b provide a carrier bather to the semiconductor layers 25a. The well layers preferably comprise, for example, a gallium nitride based semiconductor such as GaN, InGaN, AlGaN, or InAlGaN. The barrier layers 25b preferably comprise, for example, a gallium nitride based semiconductor such as GaN, InGaN, AlGaN, or InAlGaN.

In the laser diode 11, the emission wavelength of the active layer 21 is preferably not less than 250 nm and not more than 600 nm. This active layer 21 can emit light in a variety of wavelength bands.

The first guide layer 19 can comprise, for example, GaN, InGaN, InAlGaN, or the like. The first guide layer 19 preferably comprises $In_SAl_TGa_{1-S-T}N$ ($0 \leq S \leq 0.30$, $0 \leq T \leq 0.30$). This first guiding layer 19 provides the refractive index for desired optical confinement and has the thickness enough for lattice relaxation in the composition of the third Group III nitride semiconductor.

In the laser diode 11, the sum of the thickness of the active layer 21 and the thickness of the first optical guiding layer 19 is preferably not less than 200 nm. The active layer 21 and the first optical guiding layer 19 can propagate light in a variety of wavelength bands.

For the first conductivity type cladding layer 15 to be lattice-relaxed on the primary surface 13a of the semiconductor region 13, dislocations at an interface 27a between the first conductivity type cladding layer 15 and the semiconductor region 13 preferably have the density of not less than $1\times10^8$ cm$^{-2}$. In this laser diode 11, dislocations are created at the foregoing interface 27a because of generation of a slip plane resulting from use of the surface that is either of nonpolar or semipolar. Since the dislocation density is not less than $1\times10^8$ cm$^{-2}$, the first conductivity type cladding layer 15 includes the slip plane at the density enough to cause lattice relaxation in the first conductivity type cladding layer 15, at the foregoing interface 27a. The dislocations at the junction 27a preferably include components of edge dislocations. Introduction of edge dislocations can relax the strain at this junction due to the lattice constant difference.

Since the first optical guiding layer 19 is lattice-relaxed thereto on the primary surface 15a of the first conductivity type cladding layer 15, dislocations at an interface 27b between the first conductivity type cladding layer 15 and the first optical guiding layer 19 preferably have the density of not less than $1\times10^8$ cm$^{-2}$. In this laser diode 11, dislocations are produced at the foregoing interface 27b because of generation of slip plane. Since the dislocation density is not less than $1\times10^8$ cm$^{-2}$, the first optical guiding layer 19 includes slip planes, formed at the foregoing interface 27b, at the density enough to cause lattice relaxation in the first optical guiding layer 19. The dislocations at the interface 27b preferably include components of edge dislocations. Introduction of edge dislocations can relax the strain, resulting from the lattice constant difference, at this junction.

The laser diode 11 preferably further comprises a second conductivity type cladding layer 29. The second conductivity type cladding layer 29 comprises a fifth hexagonal Group III nitride semiconductor. The second conductivity type cladding layer 29 is provided on the carrier blocking layer 23, and the carrier blocking layer 23 is located between the second conductivity type cladding layer 29 and the active layer 21. The fifth hexagonal Group III nitride semiconductor is different from the third hexagonal Group III nitride semiconductor, and the second conductivity type cladding layer 29 is lattice-relaxed.

Since in this laser diode 11 the second conductivity type cladding layer 29 is provided on the primary surface 13a of the semiconductor region 13, the c-axis of the second conductivity type cladding layer 29 (which is represented by a c-axis vector VC29) is inclined with respect to the primary surface 13a of the semiconductor region 13. Hence, the second conductivity type cladding layer 29 can be made lattice-relaxed thereto. Although there is a difference between the lattice constant of the second conductivity type cladding layer 29 and the lattice constant of the underlying semiconductor region, the lattice relaxation can extend ranges of composition and thickness applicable to the second conductivity type cladding layer.

The second conductivity type cladding layer 29 can comprise GaN, AlGaN or InAlGaN. The second conductivity type cladding layer 29 preferably comprises $In_{X2}Al_{Y2}Ga_{1-X2-Y2}N$ ($0 \leq X2 \leq 0.50$, $0 \leq Y2 \leq 0.50$).

The thickness of the second conductivity type cladding layer 29 is preferably not less than 300 nm. This second conductivity type cladding layer 29 provides desired optical confinement and has the thickness enough for lattice relaxation.

The laser diode 11 preferably further comprises a semiconductor layer 35 (31, 33) which is at least either one of second optical guiding layers 31 and 33. The second optical guiding layer 35 (the second optical guiding layer will be denoted hereinafter by reference sign "35") comprises a sixth hexagonal Group III nitride semiconductor. The lattice relaxation of the second conductivity type cladding layer 29 occurs on the second optical guiding layer 35 or on the carrier blocking layer 23. When the optical guiding layer 35 is composed of plural semiconductor layers, the thicknesses of the individual semiconductor layers are smaller than the total thickness of the optical guiding layer 35.

The laser diode 11 can further comprise a second conductivity type contact layer 37 which is provided on the second conductivity type cladding layer 29. The second conductivity type contact layer 37 preferably comprises, for example, a gallium nitride based semiconductor such as GaN, AlGaN, or InAlGaN.

Since in this laser diode 11 the second optical guiding layer 35 is provided through the active layer 21 on a primary surface 19a of the first optical guiding layer 19, the second optical guiding layer 35 includes low strain built therein. This can keep the second optical guiding layer 35 (31, 33) from being lattice-relaxed. The lattice relaxation of the second conductivity type cladding layer 29 occurs on the semiconductor layer 35.

The laser diode 11 further comprises an insulating layer 39 provided on the contact layer 37. The insulating layer 39 has an aperture and an electrode 41 is in contact with the second conductivity type contact layer 37 through the aperture of the insulating layer 39.

The lattice constant of the second conductivity type cladding layer 29 is the same as that intrinsic to the fifth hexagonal Group III nitride semiconductor, or is close to this intrinsic lattice constant. The fifth hexagonal Group III nitride semiconductor is different from the sixth hexagonal Group III nitride semiconductor and the lattice constant of the second optical guiding layer 35 is the lattice constant intrinsic to the sixth hexagonal Group III nitride semiconductor, or is close to this intrinsic lattice constant. The bandgap of the fifth hexagonal Group III nitride semiconductor is larger than that of the sixth hexagonal Group III nitride semiconductor, and the refractive index of the fifth hexagonal Group III nitride semiconductor is smaller than that of the sixth hexagonal Group III nitride semiconductor.

In order to cause the second conductivity type cladding layer 29 to be lattice-relaxed on the primary surface 35a of the second optical guiding layer 35, dislocations at an interface 27c between the second conductivity type cladding layer 29 and the second optical guiding layer 35 preferably have the density of not less than $1\times10^8$ cm$^{-2}$. In this laser diode 11, dislocations are produced at the foregoing interface 27c because of creation of a slip plane resulting from the orientation of the c-axis. Since the dislocation density is not less than $1\times10^8$ cm$^{-2}$, the second conductivity type cladding layer 29 includes the slip plane at the density, which is enough to cause lattice relaxation in the second conductivity type cladding layer 29, at the foregoing interface 27c. The dislocations at the interface 27c preferably include components of edge dislocations. Due to the lattice constant difference, the introduction of edge dislocations can relax the strain at this junction.

Figure 2:
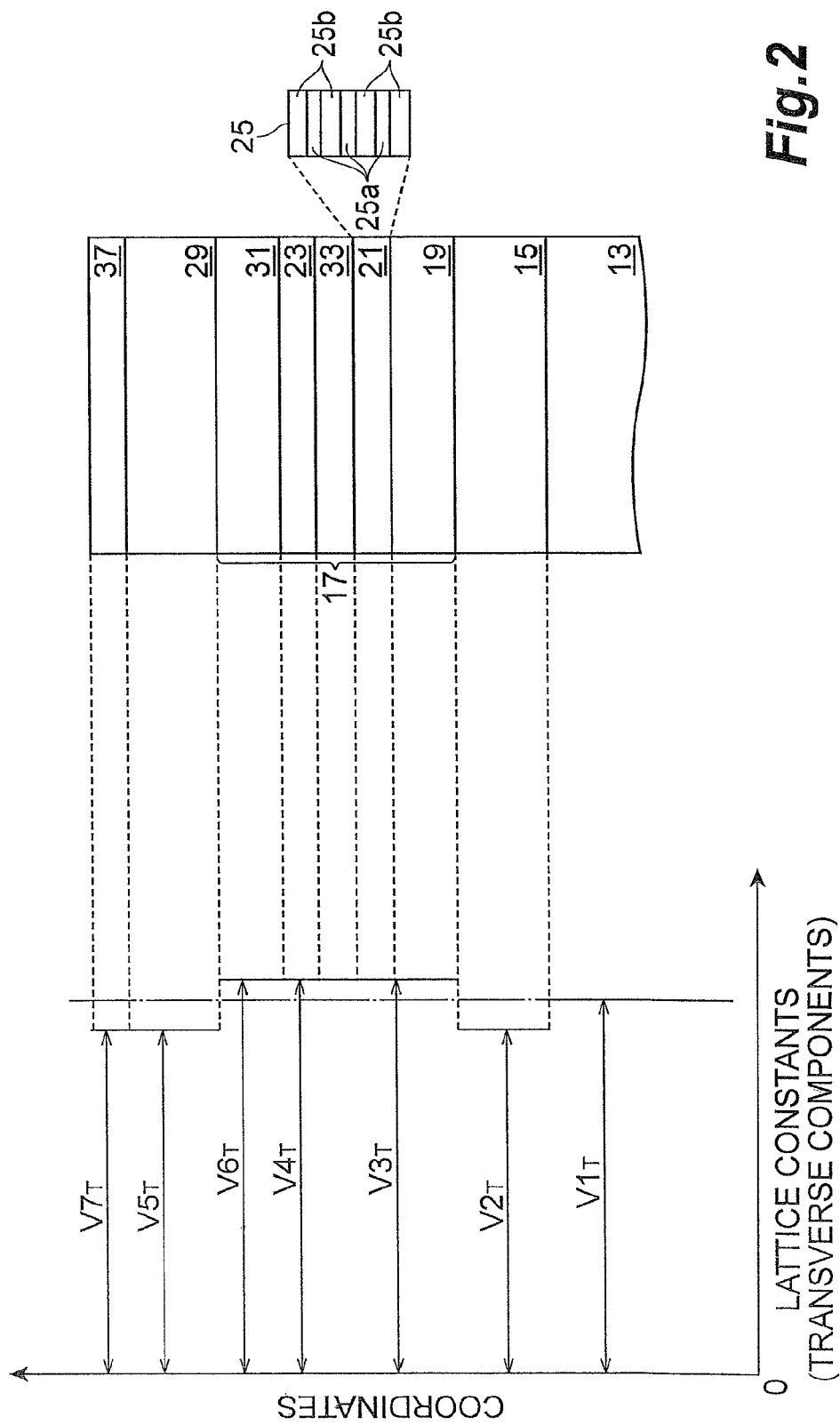
FIG. 2 is a drawing showing lattice constants of semiconductor layers constituting the laser diode.

FIG. 2 is a drawing showing the lattice constants of the semiconductor layers constituting the laser diode.

The lattice constant of the semiconductor region 13 (e.g., the lattice constant of the c-axis) is represented by a lattice vector LVC1. The lattice vector LVC1 expresses the orientation of the c-axis and the magnitude of the lattice constant dl in the c-axis direction in the first hexagonal Group III nitride semiconductor (lattice vectors for the a-axis and m-axis can also be defined in the same manner as for the c-axis). The lattice vector LVC1 includes a longitudinal component $V1_L$ in the direction of the normal axis Ax and a transverse component $V1_T$ perpendicular to the longitudinal component. The lattice constant of the first conductivity type cladding layer 15 (e.g., the lattice constant of the c-axis) is represented by a lattice vector LVC2. The lattice vector LVC2 expresses the orientation of the c-axis and the magnitude of the lattice constant d2 in the c-axis direction in the second hexagonal Group III nitride semiconductor. The lattice vector LVC2 includes a longitudinal component $V2_L$ in the direction of the normal axis Ax and a transverse component $V2_T$ perpendicular to the longitudinal component. The transverse component $V1_T$ is different from the transverse component $V2_T$. For this reason, the strain due to the lattice constant difference between the first and second hexagonal Group III nitride semiconductors is reduced in the first conductivity type cladding layer 15.

The first optical guiding layer 19 is represented by a lattice vector LVC3. The lattice vector LVC3 expresses the direction of the c-axis and the magnitude of the lattice constant d3 in the c-axis direction in the third hexagonal Group III nitride semiconductor. The lattice vector LVC3 includes a longitudinal component $V3_L$ in the direction of the normal axis Ax and a transverse component $V3_T$ perpendicular to the longitudinal component, and the transverse component $V2_T$ is different from the transverse component $V3_T$. Accordingly, the strain due to the lattice constant difference between the second and third hexagonal Group III nitride semiconductors is reduced in the first optical guiding layer 19.

The lattice constant of the second conductivity type cladding layer 29 (e.g., the lattice constant of the c-axis) is represented by a lattice vector LVC5. The lattice vector LVC5 expresses the direction of the c-axis and the magnitude of the lattice constant d5 in the c-axis direction in the fifth hexagonal Group III nitride semiconductor. The lattice vector LVC5 includes a longitudinal component $V5_L$ in the direction of the normal axis Ax and a transverse component $V5_T$ perpendicular to this longitudinal component. The transverse component $V5_T$ is preferably different from the transverse component $V3_T$. For this reason, the strain due to the lattice constant difference between the third and fifth hexagonal Group III nitride semiconductors is reduced in the second conductivity type cladding layer 29.

The lattice constant of the second optical guiding layer 35 (e.g., the lattice constant of the c-axis) is represented by a lattice vector LVC6. It expresses the direction of the c-axis and the magnitude of the lattice constant d6 in the c-axis direction in the sixth hexagonal Group III nitride semiconductor. The lattice vector LVC6 includes a longitudinal component $V6_L$ in the direction of the normal axis Ax and a transverse component $V6_T$ perpendicular to this longitudinal component. The transverse component $V6_T$ is preferably different from the transverse component $V5_T$. Accordingly, the strain due to the lattice constant difference between the fifth and sixth hexagonal Group III nitride semiconductors is reduced in the second conductivity type cladding layer 29.

The lattice constant of the second conductivity type contact layer 37 (e.g., the lattice constant of the c-axis) is represented by a lattice vector LVC7. The lattice vector LVC7 expresses the direction of the c-axis and the magnitude of the lattice constant d7 in the c-axis direction in the second conductivity type contact layer 37. The lattice vector LVC7 includes a longitudinal component $V7_L$ in the direction of the normal axis Ax and a transverse component $V7_T$ perpendicular to this longitudinal component. The transverse component $V7_T$ is preferably substantially the same as the transverse component $V5_T$. Hence, the second conductivity type contact layer 37 is not lattice-relaxed on the second conductivity type cladding layer 29.

Referring to FIG. 2, dislocations are created to the junction 27b between the core semiconductor region 17 and the first conductivity type cladding layer 15, so as to cause lattice relaxation in the first optical guiding layer 19 of the core semiconductor region 17. The remaining semiconductor layers of the core semiconductor region 17 are grown on the first optical guiding layer 19 without occurrence of lattice relaxation. Furthermore, dislocations are introduced to the junction 27c between the core semiconductor region 17 and the second conductivity type cladding layer 29, so as to cause lattice relaxation in the second conductivity type cladding layer 29 on the second optical guiding layer 35. The second conductivity type contact layer 37 is grown on the second conductivity type cladding layer 29 without occurrence of lattice relaxation. The first optical guiding layer 19, active layer 21, carrier blocking layer 23, and second optical guiding layer 35 are included in the core semiconductor region 17. The average refractive index in the core semiconductor region 17 is larger than the refractive index of the second conductivity type cladding layer 29 and larger than the refractive index of the first conductivity type cladding layer 15. Since the individual semiconductor layers in the active layer 21 are thin and not more than the critical thickness, the active layer 21 is strained according to the lattice constant of the first optical guiding layer 19. The carrier blocking layer 23 comprises the fourth hexagonal Group III nitride semiconductor, and the lattice constant thereof (e.g., the lattice constant of the c-axis) is represented by the lattice vector LVC4. The transverse component $V4_T$ of the lattice vector LVC4 is substantially equal to the transverse component $V3_T$ in the third hexagonal Group III nitride semiconductor. The carrier blocking layer 23 is strained in association with the lattice constant of the first optical guiding layer 19. The lattice constant of the second optical guiding layer 35 is substantially equal to the lattice constant of the first optical guiding layer 19.

Figure 3:
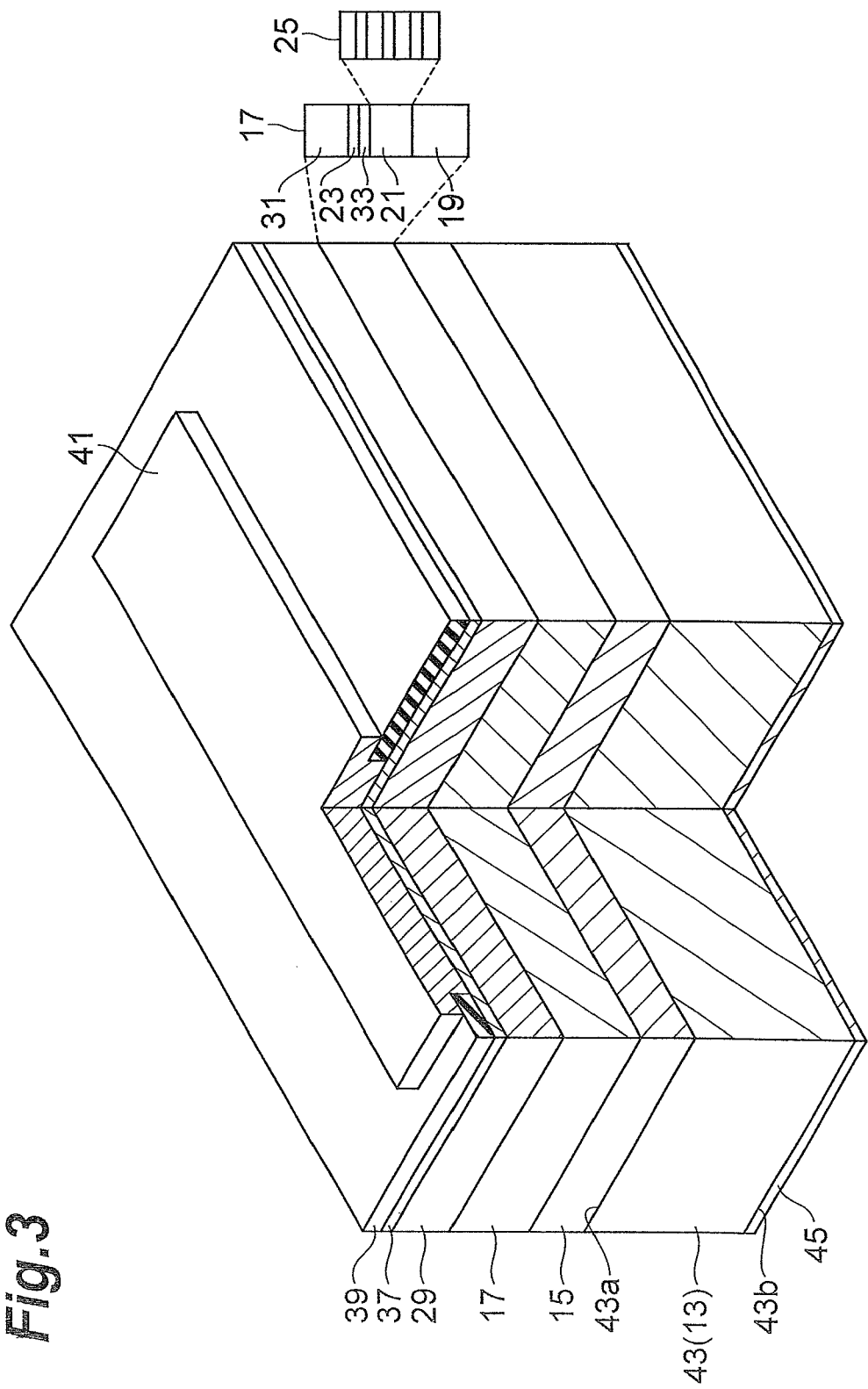
FIG. 3 is a perspective view schematically showing the laser diode shown in FIG. 1.

FIG. 3 is a perspective view schematically showing the laser diode shown in FIG. 1. The laser diode 11 preferably further comprises a support body 43. The first conductivity type cladding layer 15, core semiconductor region 17, and second conductivity type cladding layer 29 are mounted on a primary surface 43a of the support body 43. The nonpolar primary surface 43a of the support body 43 can provide the primary surface 13a of the semiconductor region 13 comprised of the first hexagonal Group III nitride semiconductor. The polarity character that is not c-plane polar character is either of semipolar nature and nonpolar nature. For this reason, the primary surface 43a of the support body 43 of the character that is not c-plane polar character makes an angle of not less than 10 degrees with respect to the reference plane R1. By using the support body 43 with the primary surface 43a having the character that is not c-plane polar character, it is feasible to cause lattice relaxation of the semiconductor according to a given condition. The support body 43 preferably comprises $Al_ZGa_{1-Z}N$ ($0 \leq Z \leq 1$). With this support body 43, it becomes feasible to securely implement not only the generation of lattice relaxation of the semiconductor but also growth of Group III nitrides with excellent crystal quality. For example, the support body 43 is preferably comprised of GaN, AlGaN, or AlN. The support body 43 preferably has electrical conductivity, e.g., n-type.

The laser diode 11 can further comprise another electrode 45 provided on a back surface 43b of the support body 43. In an example, the electrode 41 may be, for example, an anode and the electrode 45, for example, a cathode. In the example shown in FIG. 3, the electrode 41 extends in one direction and the electrode 45 is provided over the entire area of the back surface 43b.

Figure 4:
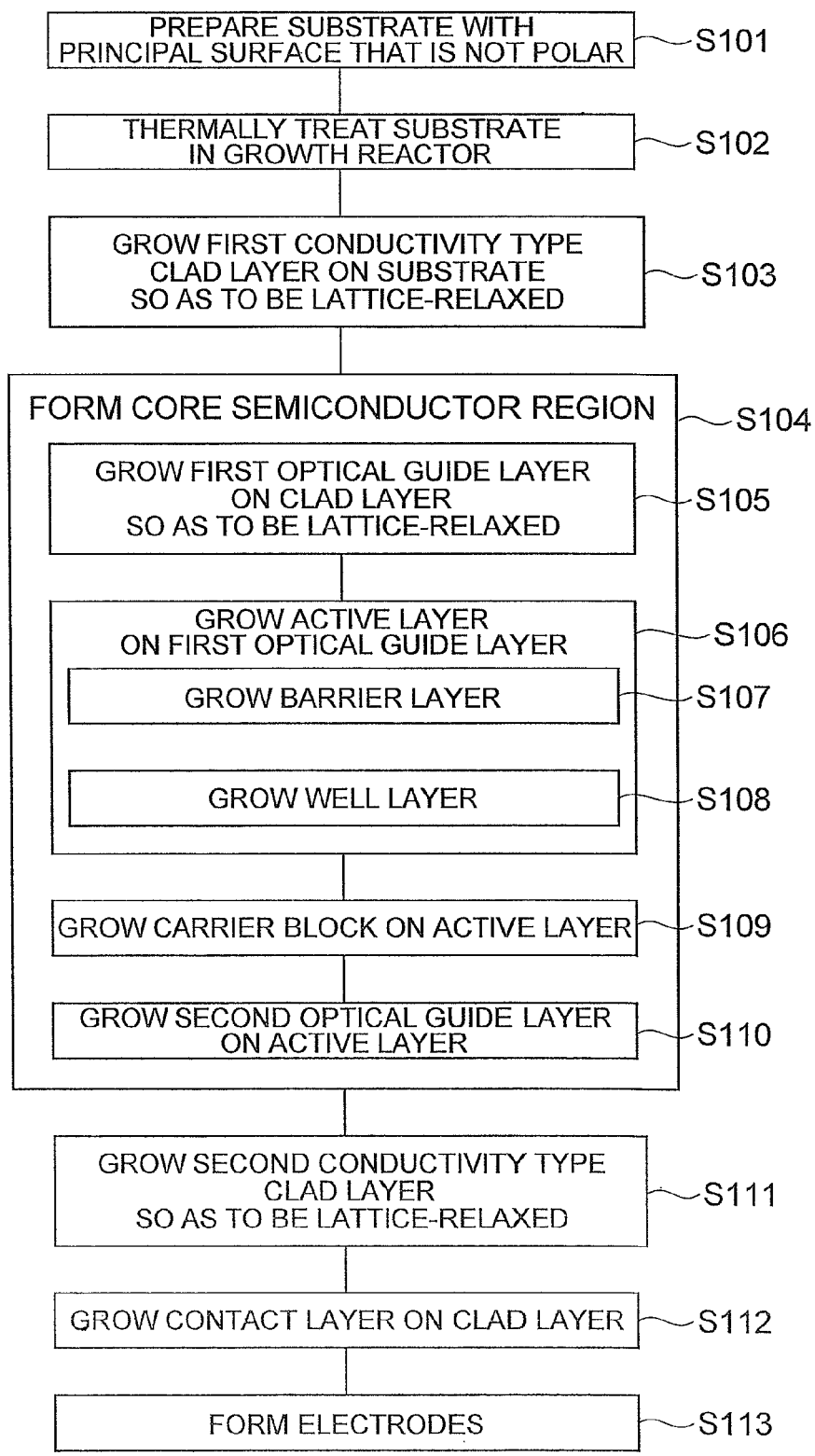
FIG. 4 is a drawing showing a step flow in a method for fabricating an epitaxial substrate and a Group III nitride semiconductor laser diode according to an embodiment of the present invention.
Figure 5:
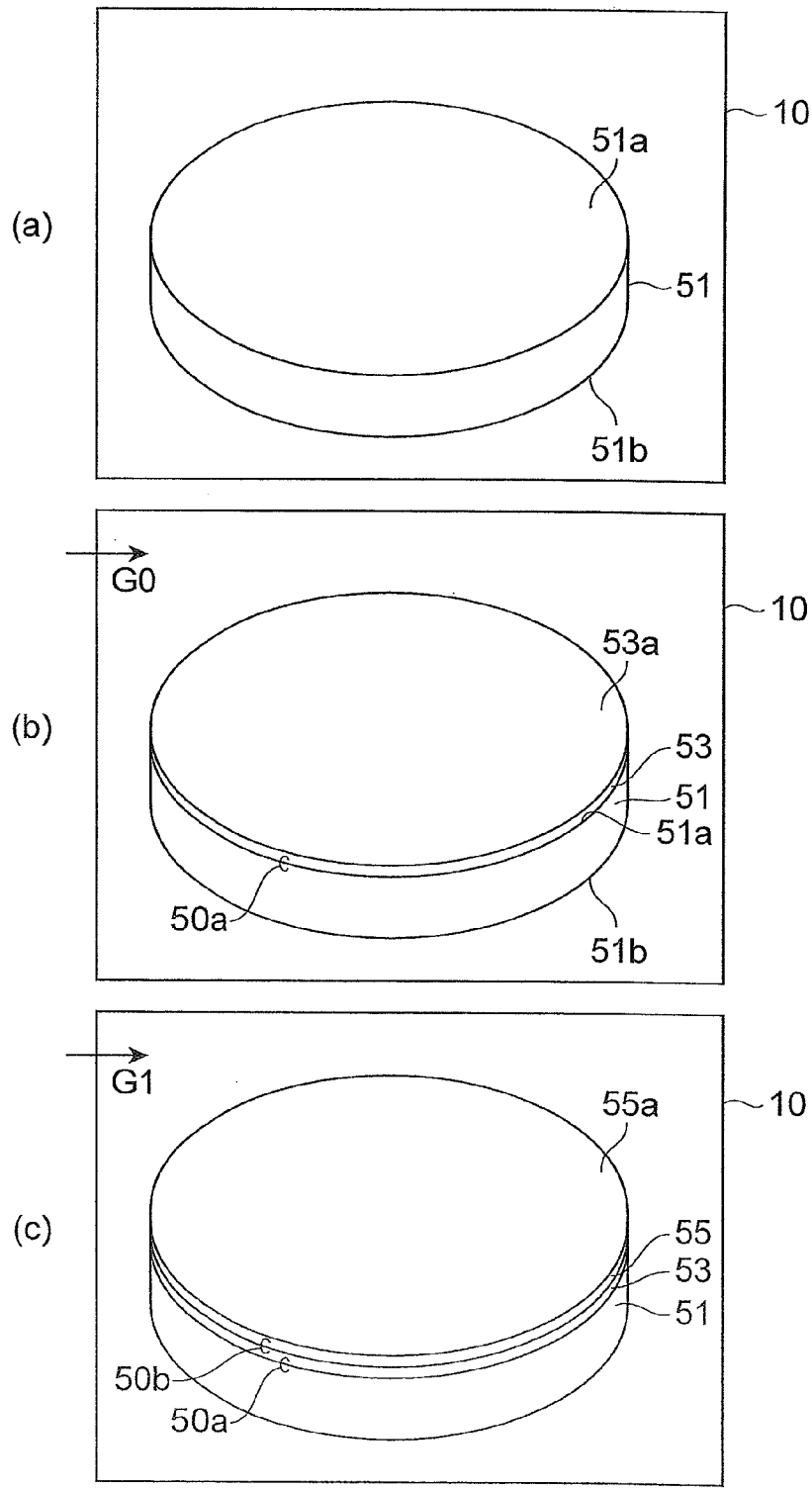
FIG. 5 is a drawing showing products in major steps in the foregoing production method.
Figure 6:
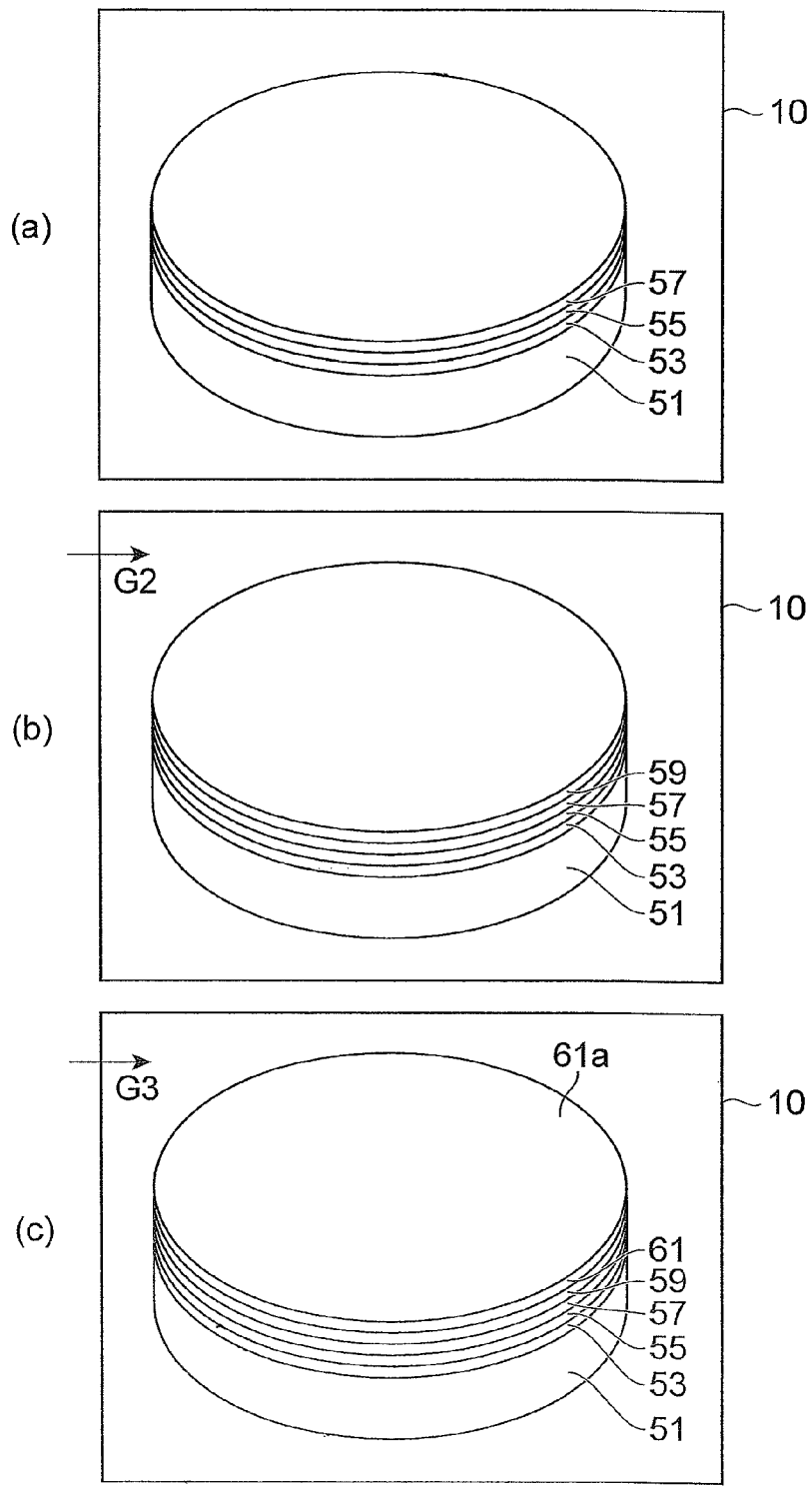
FIG. 6 is a drawing showing products in major steps in the foregoing production method.
Figure 7:
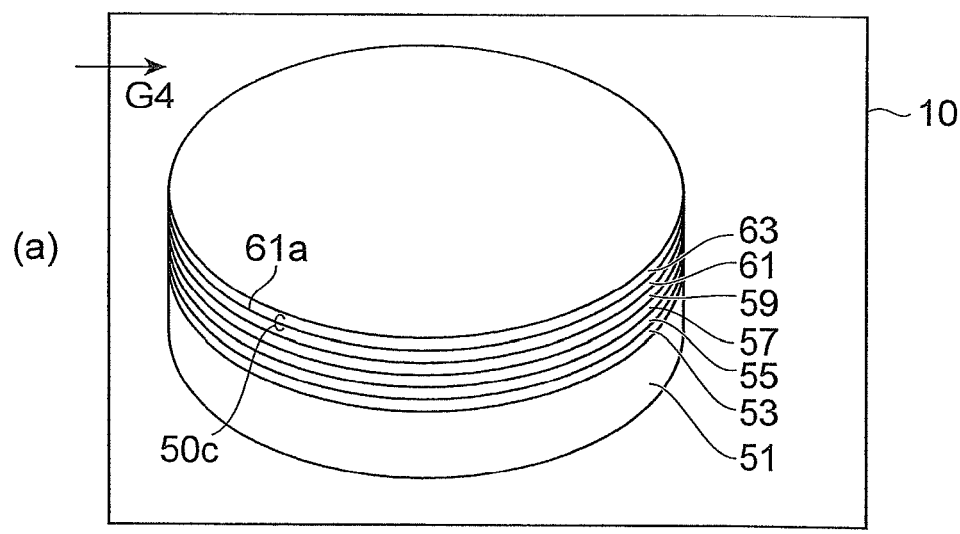
FIG. 7 is a drawing showing products in major steps in the foregoing production method.
Figure 7:
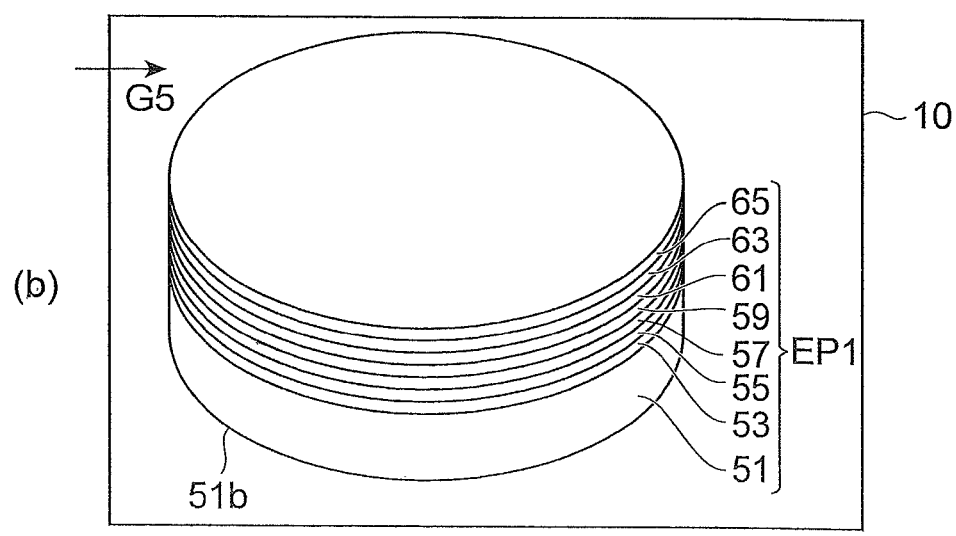

FIG. 4 is a drawing showing a step flow in a method for fabricating an epitaxial substrate and a Group III nitride semiconductor laser diode according to an embodiment of the present invention. FIGS. 5 to 7 are drawings showing products in major steps in the foregoing production method.

An epitaxial structure of a light emitting device is produced by the metal-organic vapor phase epitaxy method. The raw materials used are trimethylgallium (TMG), trimethylaluminum (TMA), trimethylindium (TMI), and ammonia ($NH_3$). Dopant gases used are silane ($SiH_4$) and bis(cyclopentadienyl)magnesium ($CP_2Mg$). In the description hereinafter, a hexagonal gallium nitride substrate can be used, for example, as a Group III nitride semiconductor substrate with a nonpolar primary surface. A hexagonal nonpolar gallium nitride substrate can be used, for example, as a Group III nitride semiconductor substrate with a nonpolar primary surface. As another example, a hexagonal semipolar gallium nitride substrate can be used, for example, as a Group III nitride semiconductor substrate with a semipolar primary surface. In the description hereinafter, the method will be described with reference to the hexagonal semipolar gallium nitride substrate.

In Step S101, a gallium nitride (GaN) substrate 51 is prepared, as shown in FIG. 5 (a). A primary surface 51a of the GaN substrate 51 is inclined at an angle in the range of 10 degrees to 170 degrees from a c-plane toward an m-plane or from a c-plane toward an a-plane. After the GaN substrate 51 is placed in a growth reactor 10, in step S102 thermal cleaning of the GaN substrate 51 is performed using the growth reactor 10. At the temperature of 1050 Celsius degrees, a thermal treatment is carried out for ten minutes under flow of a gas containing $NH_3$ and $H_2$ into the growth reactor 10.

In Step S103 is, as shown in FIG. 5 (b), a source gas G0 containing Group III and nitrogen raw materials is supplied to the growth reactor 10 to epitaxially grow a gallium nitride based semiconductor layer 53 of a first conductivity type (which will be "n-type" in the description below) on the primary surface 51a of the GaN substrate 51. The gallium nitride based semiconductor layer 53 serves as an n-type cladding layer. The gallium nitride based semiconductor layer 53 is grown on the primary surface 51a of the GaN substrate 51 so that the gallium nitride based semiconductor layer 53 is lattice-relaxed thereto. For example, a Si-doped AlGaN cladding layer is grown as the gallium nitride based semiconductor layer 53. The presence/absence of lattice relaxation on the plane that is not c-plane can be controlled by the composition, thickness, and lattice constant difference of the AlGaN semiconductor to be grown thereon. This lattice constant difference is defined by GaN in the primary surface 51a of the GaN substrate 51 and AlGaN of the gallium nitride based semiconductor layer 53 to make a junction therewith. The thickness of this AlGaN layer can be, for example, 2 μm. The Al composition of the gallium nitride based semiconductor layer 53 can be, for example, 0.08. The thickness of the AlGaN layer is greater than the critical thickness in this composition. The source gas G0 contains, for example, TMG, TMA, $NH_3$ and $SiH_4$, and the growth temperature is, for example, 1150 Celsius degrees. Since the gallium nitride based semiconductor layer 53 is lattice-relaxed, a large number of dislocations (e.g., misfit dislocations) are generated at the junction 50a between the substrate 51 and the gallium nitride based semiconductor layer 53.

Next, in step S104, a core semiconductor region is grown on the gallium nitride based semiconductor layer 53. First, in step S105, as shown in FIG. 5 (c), a source gas G1 containing Group III and nitrogen raw materials is supplied to the growth reactor 10 to epitaxially grow a first optical guiding layer 55 on the gallium nitride based semiconductor layer 53. The first optical guiding layer 55 is grown on a primary surface 53a of the gallium nitride based semiconductor layer 53 so that the first optical guiding layer 55 is lattice-relaxed thereto. This optical guiding layer 55 comprises, for example, undoped GaN. The thickness of this GaN film is, for example, 300 nanometers. If necessary, a partial region or an entire region of the optical guiding layer 55 can be n-type doped. The presence/absence of lattice relaxation on the plane that is not c-plane can be controlled by the composition, thickness, and lattice constant difference of the GaN semiconductor to be grown thereon. This lattice constant difference is defined by AlGaN in the primary surface 53a of the AlGaN layer 53 with the Al composition of 0.08 and GaN of the optical guiding layer 55 to make a junction therewith. The thickness of the optical guiding layer 55 is larger than the critical thickness in this thickness. The growth temperature of this GaN is, for example, 1150 Celsius degrees. The source gas G1 contains, for example, TMG and $NH_3$. Since the optical guiding layer 55 is lattice-relaxed, a large number of dislocations (e.g., misfit dislocations) are generated at the junction 50b between the gallium nitride based semiconductor layer 53 and the optical guiding layer 55.

Subsequently, in step S106 is, an active layer 57 having a quantum well structure is grown, as shown in FIG. 6 (a). After the growth of the optical guiding layer 55, the substrate temperature is decreased to 870 Celsius degrees. In Step S107, a source gas containing Group III and nitrogen raw materials is supplied to the growth reactor 10 to grow a GaN barrier layer on the InGaN optical guiding layer 55 at the substrate temperature of 870 Celsius degrees. The source gas for GaN barrier layer contains, for example, TMG and $NH_3$. The thickness of this GaN barrier layer is, for example, 15 nm. Next, the substrate temperature is decreased to 750 Celsius degrees. In Step S108, a source gas containing Group III and nitrogen raw materials is supplied to the growth reactor 10 to epitaxially grow an undoped InGaN well layer at the substrate temperature of 750 Celsius degrees on the GaN barrier layer. The thickness of the InGaN well layer can be, for example, 3 nm. The In composition of the InGaN well layer can be, for example, 0.25. If necessary, the growth of the barrier layer and well layer is repeatedly carried out to grow the active layer 57. Each of the thicknesses of the barrier layer and well layer of the active layer 57 is smaller than the critical thickness of the barrier layer and well layer and thus, for example, the well layer includes incorporated strain.

In Step S109, the substrate temperature is increased to 1000 Celsius degrees and thereafter a source gas G2 containing Group III and nitrogen raw materials is introduced into the growth reactor 10 to epitaxially grow a carrier blocking layer (to block electrons in this example) 59 on the active layer 57, as shown in FIG. 6 (a). The source gas G2 contains, for example, TMG; TMA, $NH_3$, and $CP_2Mg$. The thickness of the carrier blocking layer 59 is, for example, 10 nm and the Al composition thereof, for example, 0.12. Since the thickness of the carrier blocking layer 59 is smaller than the critical thickness thereof, the carrier blocking layer 59 includes incorporated strain.

In Step S110, a source gas G3 containing Group III and nitrogen raw materials is supplied to the growth reactor 10 at the substrate temperature of 900 Celsius degrees to epitaxially grow an undoped GaN optical guiding layer 61 in the same manner as in the case of the optical guiding layer 55. This optical guiding layer 61 is grown so that the optical guiding layer 61 is not lattice-relaxed. In most cases, since the composition of the optical guiding layer 61 is equal to or very close to the composition of the optical guiding layer 55, strain of the optical guiding layer 61 is also zero or very low. The thickness of the optical guiding layer 61 is smaller than the critical thickness.

If necessary, the optical guiding layer 61 can be grown prior to the growth of the carrier blocking layer 59. In the growth of the optical guiding layer 61, a part of the optical guiding layer 61 can be grown prior to the growth of the carrier blocking layer 59, and the rest of the optical guiding layer 61 can be grown after the growth of the carrier blocking layer 59. On this occasion, the region of the optical guiding layer 61 grown after the growth of the carrier blocking layer 59 can be p-type doped.

Next, in step S111, a source gas G4 containing Group III and nitrogen raw materials is introduced into the growth reactor 10 to epitaxially grow a gallium nitride based semiconductor layer 63 of a second conductivity type (which will be "p-type" in the description below) on the second optical guiding layer 61, as shown in FIG. 7 (a). The gallium nitride based semiconductor layer 63 serves as a p-type cladding layer. The gallium nitride based semiconductor layer 63 is grown on a primary surface 61a of the second optical guiding layer 61 so that the gallium nitride based semiconductor layer 63 is lattice-relaxed thereto. For example, a Mg-doped AlGaN cladding layer is grown as the gallium nitride based semiconductor layer 63. The presence/absence of lattice relaxation on the plane with polarity that is not the polarity of c-plane can be controlled by the composition, thickness, and lattice constant difference of the AlGaN semiconductor to be grown thereon. This lattice constant difference is defined by GaN in the primary surface 61a of the second optical guiding layer 61 and AlGaN of the gallium nitride based semiconductor layer 63 to make a junction 50c therewith. The thickness of this AlGaN layer is, for example, 400 nanometers. The Al composition of the gallium nitride based semiconductor layer 63 is, for example, 0.08. The thickness of this AlGaN layer is over the critical thickness. The source gas G4 contains, for example, TMG, TMA, $NH_3$ and $CP_2Mg$. The growth temperature is, for example, 900 Celsius degrees. Since the gallium nitride based semiconductor layer 63 is lattice-relaxed, a large number of dislocations (e.g., misfit dislocations) are generated at the junction 50c between the second optical guiding layer 61 and the gallium nitride based semiconductor layer 63.

Subsequently, in step S112 a source gas G5 containing Group III and nitrogen raw materials is introduced into the growth reactor 10 to epitaxially grow a p-type contact layer 65 on the p-type gallium nitride based semiconductor layer 63, as shown in FIG. 7 (b). The source gas G5 contains, for example, TMG, $NH_3$ and $CP_2Mg$. The thickness of the p-type contact layer 65 can be, for example, 50 nm. Since the thickness of the p-type contact layer 65 is smaller than the critical thickness thereof, the p-type contact layer 65 includes incorporated strain.

In step S113, an insulating film with a contact window is formed thereon and thereafter an anode electrode is formed on the p-type gallium nitride based semiconductor region of epitaxial substrate EP1 to make an electrical connection to the p-type contact layer 65, and if necessary a back surface 51b of the substrate 51 is polished and then a cathode electrode is formed on the polished back surface. These electrodes are produced, for example, by evaporation.

EXAMPLE 1

Figure 8:
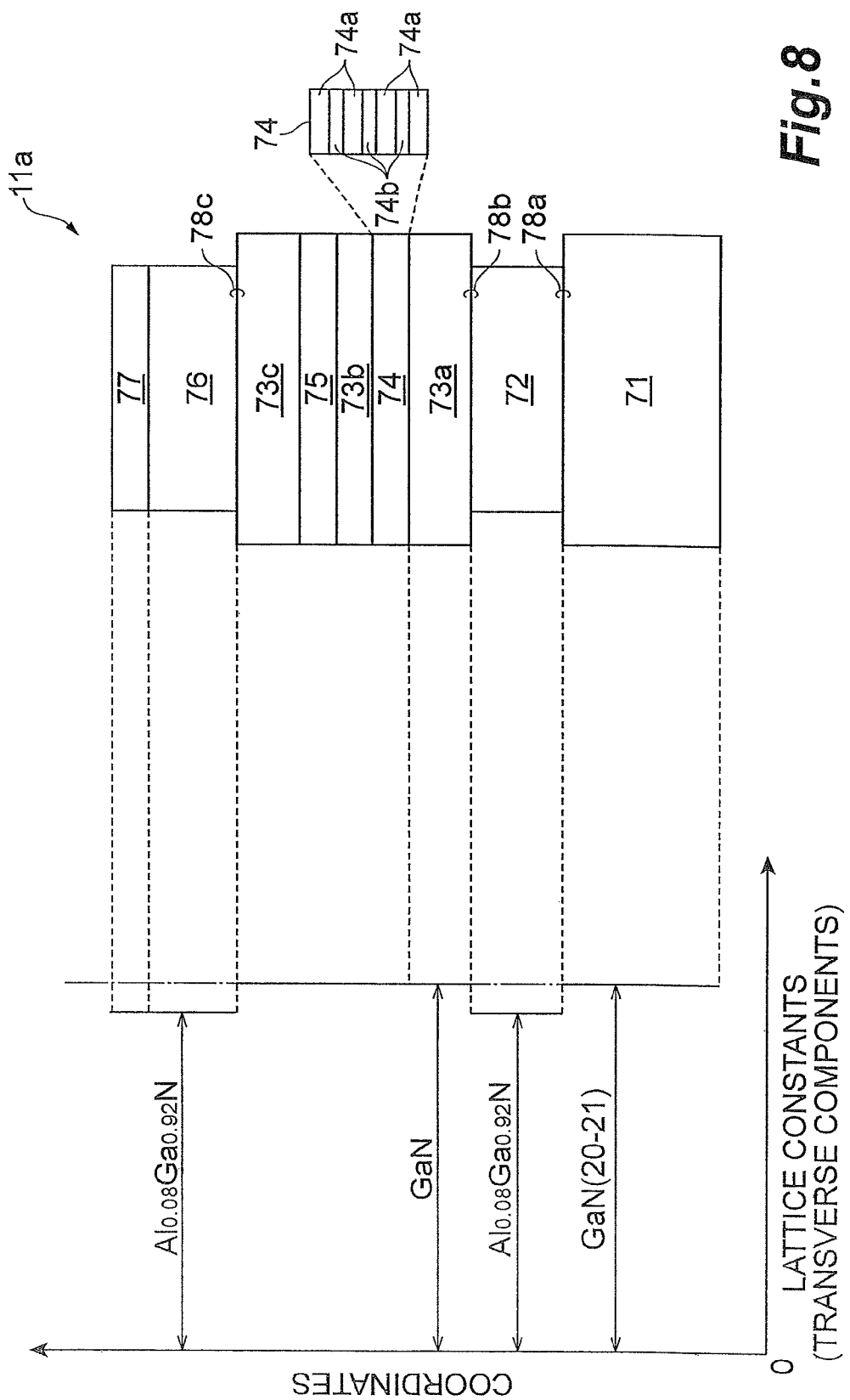
FIG. 8 is a drawing showing the lattice constants and the structure of a semiconductor laser in Example 1.

FIG. 8 is a drawing showing a structure and strains of a semiconductor laser in Example 1. A semiconductor laser 11a is produced as described below. A (20-21)-plane GaN substrate 71 is prepared. After thermal cleaning thereof, an n-type $Al_{0.08}Ga_{0.92}N$ cladding layer 72 is grown on a (20-21) plane of the GaN substrate 71. The growth temperature thereof is 1150 Celsius degrees and the thickness is 2 micrometers. A GaN optical guiding layer 73a is grown on the n-type $Al_{0.08}Ga_{0.92}N$ cladding layer 72. The growth temperature thereof is 1150 Celsius degrees and the thickness is 300 nanometers.

An active layer 74 is grown on the GaN optical guiding layer 73a. The growth of the active layer 74 is carried out by alternately growing GaN barrier layers 74a and $In_{0.25}Ga_{0.75}N$ well layers 74b. The growth temperature of the barrier layers 74a is 870 Celsius degrees and the thickness thereof is 15 nanometers. The growth temperature of the well layers 74b is 750 Celsius degrees and the thickness thereof is 3 nanometers. A GaN optical guiding layer 73b is grown on the active layer 74. The growth temperature thereof is 900 Celsius degrees and the thickness is 50 nanometers. Next, an $Al_{0.12}Ga_{0.88}N$ electron blocking layer 75 is grown on the GaN optical guiding layer 73b. The growth temperature is 900 Celsius degrees and the thickness is 10 nanometers. After this, a GaN optical guiding layer 73c is grown on the electron blocking layer 75. The growth temperature is 900 Celsius degrees and the thickness is 250 nanometers.

A p-type $Al_{0.08}Ga_{0.92}N$ cladding layer 76 is grown on the GaN optical guiding layer 73c. The growth temperature thereof is 900 Celsius degrees and the thickness is 400 nanometers. A p-type GaN contact layer 77 is grown on the p-type cladding layer 76. The growth temperature thereof is 900 Celsius degrees and the thickness is 50 nanometers. A silicon oxide film is grown on the p-type GaN contact layer 77 and thereafter a contact window is formed in the silicon oxide film by photolithography. The contact window is a stripe shape in the width of 10 micrometers. An anode electrode is formed on the contact window and silicon oxide film, and a cathode electrode is formed on the back surface of the GaN substrate 71. The anode electrode comprises Ni/Au. The cathode electrode comprises Ti/Al. Pad electrodes are comprised of Ti/Au. This substrate product is cleaved at intervals of 800 micrometers to produce gain-guiding type lasers.

This gain-guiding type laser 11a lased at the wavelength of 500 nm. The threshold current was 20 $kA/cm^2$. In FIG. 8, since the semiconductor layer 72 is lattice-relaxed, there are no restrictions on the lattice constant of the semiconductor layer 72 imposed by the lattice constant of the underlying semiconductor 71. For example, the transverse width of the figure showing the semiconductor 71 and the transverse width of the figure showing the semiconductor layer 72 in FIG. 8 represent the magnitude relationship of the lattice constants in the device. Since the semiconductor layer 72, semiconductor layer 73a, and semiconductor 76 are lattice-relaxed, the dislocation densities at the junctions 78a, 78b, and 78c are larger than those at the junctions in the core semiconductor region (73a, 74, 73b, 75, and 73c).

Figure 9:
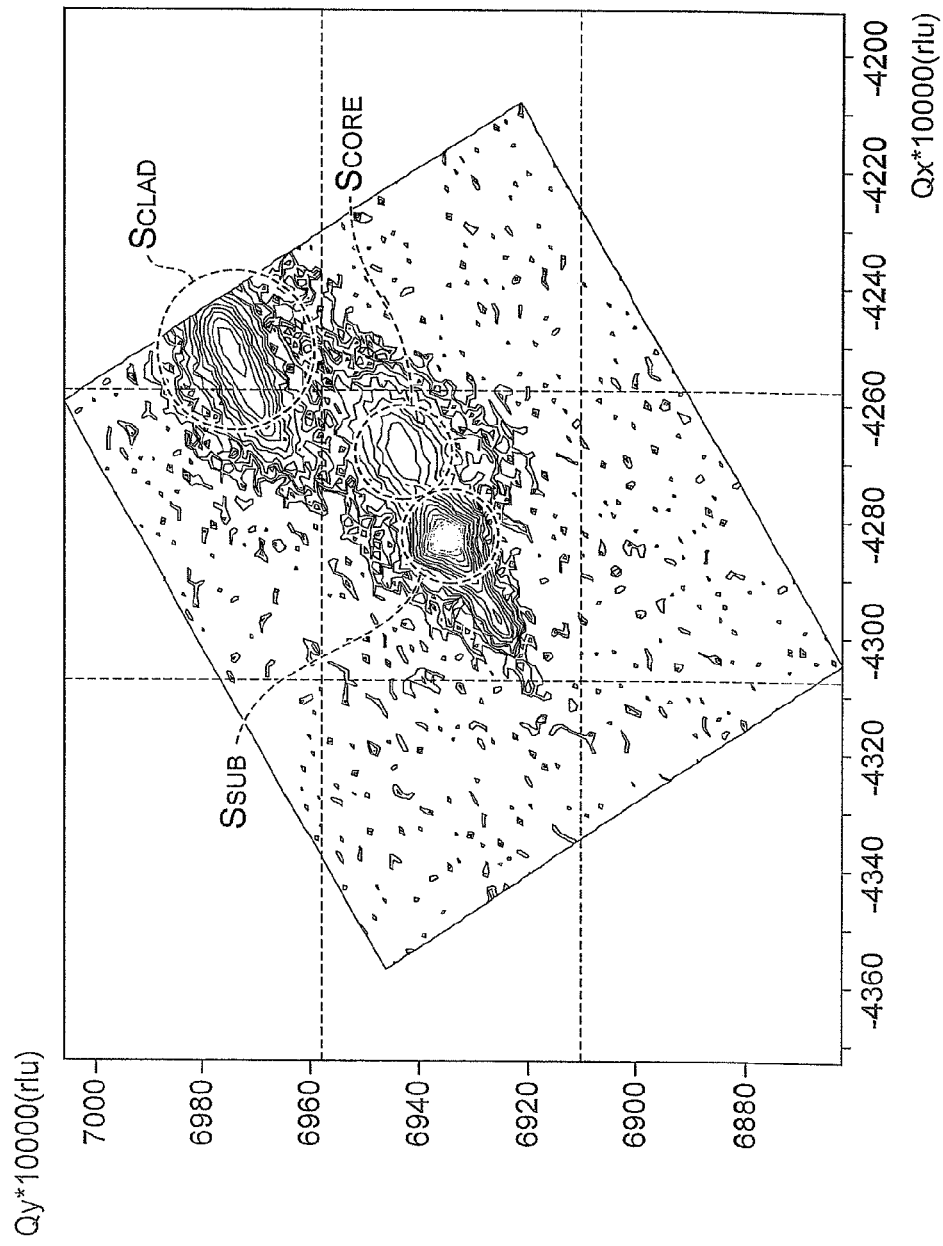
FIG. 9 is a drawing showing reciprocal lattice mapping of the epitaxial substrate shown in FIG. 8.

FIG. 9 is a drawing showing reciprocal lattice mapping of the epitaxial substrate shown in FIG. 8. With reference to FIG. 9, signal $S_{SUB}$ indicates a signal from the GaN substrate, signal $S_{CORE}$ a signal from the core semiconductor region, and signal $S_{CLAD}$ a signal from the cladding semiconductor region. Since the peak intensities of these signals are not aligned on a straight line extending in parallel with the vertical axis, the lattice constants of the three semiconductor regions are different from each other. In the reciprocal lattice mapping, when signal peaks are aligned on a line segment parallel to the vertical axis, the transverse components of the lattice constants in the semiconductors corresponding to these signals are the same as each other at the respective interfaces. Therefore, FIG. 9 shows occurrence of lattice relaxation at the interface between the substrate and the n-type cladding layer, at the interface between the n-type cladding layer and the lower optical guiding layer, and at the interface between the upper optical guiding layer and the p-type cladding layer.

Since the n-type cladding layer and p-type cladding layer are lattice-relaxed, they are obtained as crack-free cladding layers of high aluminum composition, so that optical confinement is improved in this semiconductor laser 11a.

The optical guiding layer is lattice-relaxed with respect to the n-type cladding layer and the lattice-relaxed optical guiding layer can reduce the strain of the active layer as compared with an optical guiding layer coherently grown on the n-type cladding layer. When the active layer is grown on the lattice-relaxed optical guide layer, the strain amount of this active layer can be equivalent to or smaller than the strain amount of the active layer coherently grown on the GaN substrate. Therefore, it is feasible to suppress reduction of optical output due to the strain of the active layer.

Accordingly, Example 1 achieves both of improvement in optical confinement and preservation of optical output. For this reason, the lasing threshold is reduced.

EXAMPLE 2

Figure 10:
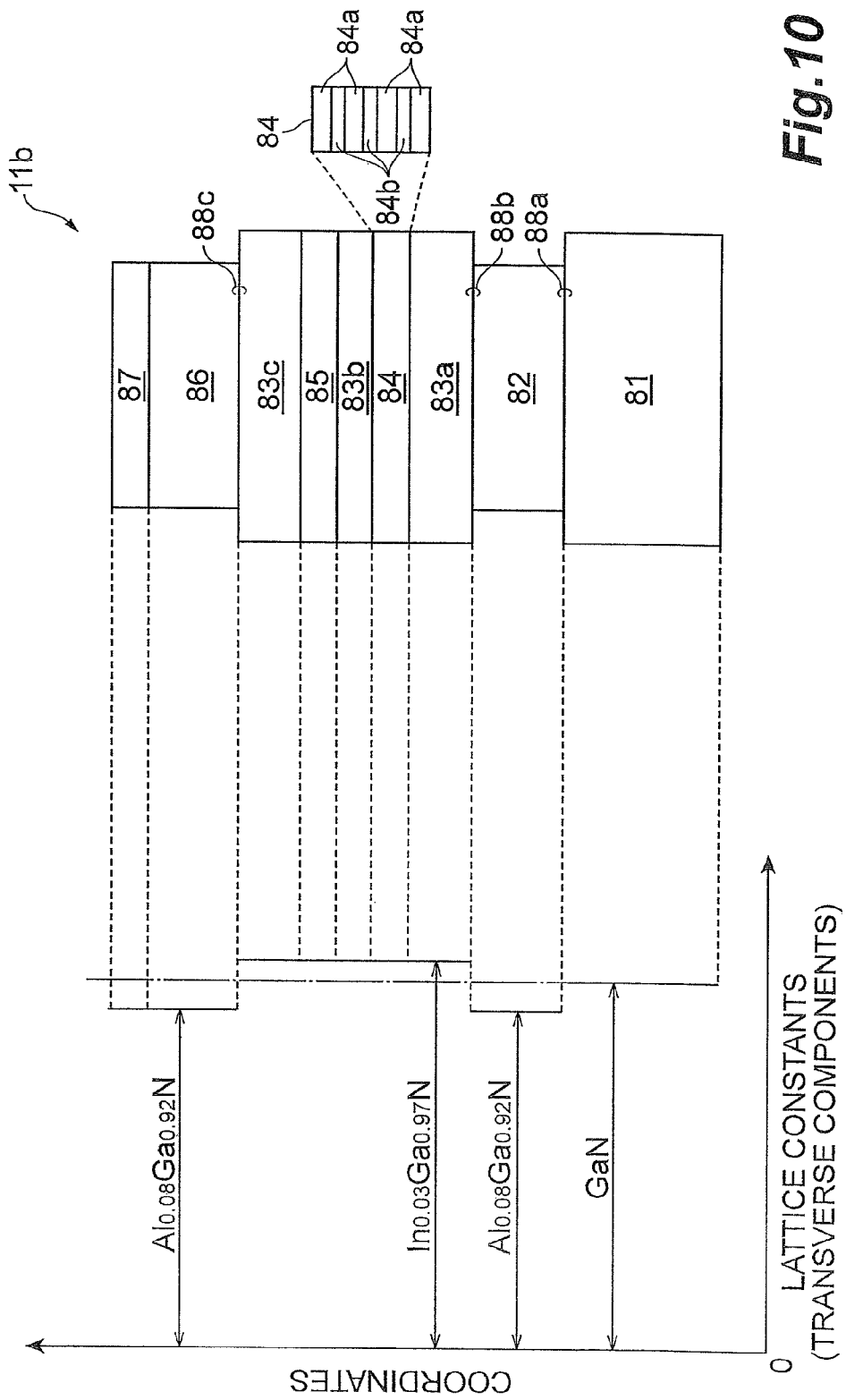
FIG. 10 is a drawing showing the lattice constants and the structure of a semiconductor laser in Example 2.

FIG. 10 is a drawing showing a structure and strains of a semiconductor laser in Example 2. A semiconductor laser 11b is produced as described below. A (20-21)-plane GaN substrate 81 is prepared. After thermal cleaning thereof, an n-type $Al_{0.08}Ga_{0.92}N$ cladding layer 82 is grown on a (20-21) plane of the GaN substrate 81. The growth temperature thereof is 1150 Celsius degrees and the thickness is 2 micrometers. An $In_{0.03}Ga_{0.97}N$ optical guiding layer 83a is grown on the n-type $Al_{0.08}Ga_{0.92}N$ cladding layer 82. The thickness thereof is 300 nanometers.

An active layer 84 is grown on the optical guiding layer 83a. The active layer 84 is grown by alternately growing $In_{0.03}Ga_{0.97}N$ barrier layers 84a and $IN_{0.25}Ga_{0.75}N$ well layers 84b. The thickness of the barrier layers 84a is 15 nanometers. The thickness of the well layers 84b is 3 nanometers. An $In_{0.03}Ga_{0.97}N$ optical guiding layer 83b is grown on the active layer 84. The thickness thereof is 50 nanometers. Next, an $Al_{0.12}Ga_{0.88}N$ electron blocking layer 85 is grown on the optical guiding layer 83b. The growth temperature is 900 Celsius degrees and the thickness is 10 nanometers. After this, an $In_{0.03}Ga_{0.97}N$ optical guiding layer 83c is grown on the electron blocking layer 85. The thickness thereof is 250 nanometers.

A p-type $Al_{0.08}Ga_{0.92}N$ cladding layer 86 is grown on the optical guiding layer 83c. The growth temperature thereof is 900 Celsius degrees and the thickness is 400 nanometers. A p-type GaN contact layer 87 is grown on the p-type cladding layer 86. The growth temperature thereof is 900 Celsius degrees and the thickness is 50 nanometers. After a silicon oxide film is grown on the p-type GaN cladding layer 87, a contact window is formed in the silicon oxide film by photolithography. The contact window is a stripe shape in the width of 10 micrometers. An anode electrode is found on the contact window and silicon oxide film, and a cathode electrode is formed on a back surface of the GaN substrate 81. The anode electrode is made of Ni/Au. The cathode electrode is comprised of Ti/Al. Pad electrodes are made of Ti/Au. This substrate product is cleaved at intervals of 800 micrometers to produce gain-guiding type lasers.

This gain-guiding type laser 11b lased at the wavelength of 500 nm. The threshold current is 10 $kA/cm^2$. As shown in FIG. 10, since the semiconductor layer 82 is lattice-relaxed, there are no restrictions on the lattice constant of the semiconductor layer 82 imposed by the lattice constant of the underlying semiconductor 81. For example, the transverse width of the figure showing the semiconductor 81 and the transverse width of the figure showing the semiconductor layer 82 indicate the magnitude relationship of their lattice constants. Since the semiconductor layer 82, semiconductor layer 83a, and semiconductor 86 are lattice-relaxed, the dislocation densities at the junctions 88a, 88b, and 78c are larger than those at the other junctions.

Figure 11:
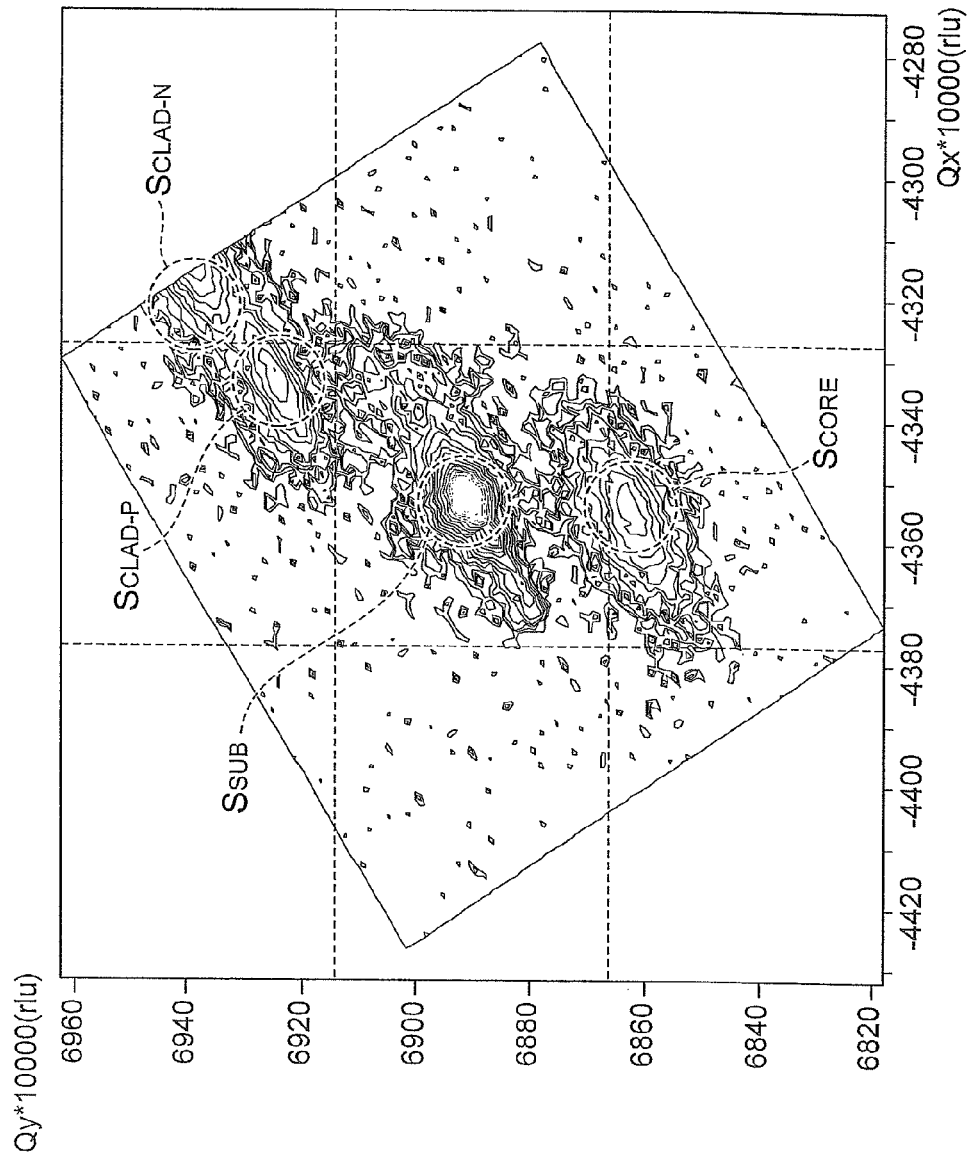
FIG. 11 is a drawing showing reciprocal lattice mapping of the epitaxial substrate shown in FIG. 10.

FIG. 11 is a drawing showing reciprocal lattice mapping of the epitaxial substrate shown in FIG. 10. With reference to FIG. 11, signal $S_{SUB}$ indicates a signal from the GaN substrate, signal $S_{CORE}$ indicates a signal from the core semiconductor region, signal $S_{CLAD-P}$ indicates a signal from the p-type cladding semiconductor region, and signal $S_{CLAD-N}$ indicates a signal from the n-type cladding semiconductor region. Since the peak intensities of these signals are not aligned on a straight line extending in parallel with the vertical axis, the lattice constants of the four semiconductor regions are different from each other. Therefore, FIG. 11 shows occurrence of lattice relaxation at the interface 88a between the substrate and the n-type cladding layer, at the interface 88b between the n-type cladding layer and the lower optical guiding layer, and at the interface 88c between the upper optical guiding layer and the p-type cladding layer.

The lower optical guiding layer is lattice-relaxed with respect to the n-type cladding layer and thus the InGaN film can be grown without occurrence of blackening in growth of InGaN. Furthermore, since the In composition can be made higher, the refractive-index difference between cladding/guide can be increased. Therefore, the optical confinement property is improved. Since the n-type cladding layer and p-type cladding layer are lattice-relaxed, they are obtained as crack-free cladding layers of high aluminum composition. Therefore, the optical confinement is improved in this semiconductor laser 11b.

The optical guiding layer is lattice-relaxed with respect to the n-type cladding layer and the lattice-relaxed optical guiding layer can reduce the strain of the active layer as compared with an optical guiding layer coherently grown on the n-type cladding layer. When the active layer is grown on the lattice-relaxed optical guiding layer, the strain amount of this active layer can be made smaller as compared with the strain amount of the active layer coherently grown on the GaN substrate. Therefore, it is feasible to suppress reduction of optical output due to the strain of the active layer.

Accordingly, Example 2 achieves both of improvement in optical confinement and preservation of optical output. Therefore, the lasing threshold is reduced.

The GaN substrate exhibiting semipolar character is used in Example 1 and Example 2, but the same technical contribution can also be achieved in semiconductor lasers produced using a GaN substrate exhibiting nonpolar character. The inclination angle of the semipolar primary surface is preferably in the range of not less than 10 degrees and not more than 80 degrees and the range of not less than 100 degrees and not more than 170 degrees. Furthermore, the inclination angle of the semipolar primary surface is more preferably in the range of not less than 63 degrees and not more than 80 degrees and the range of not less than 100 degrees and not more than 117 degrees.

The principle of the present invention has been illustrated and explained in the preferred embodiments, but it should be noted that it is recognized by those skilled in the art that the present invention can be modified in arrangement and details without departing from the principle of the invention. The present invention is by no means limited to the specific configurations disclosed in the embodiments of the present invention. Therefore, the applicants claim all modifications and changes resulting from the scope of claims and the scope of spirit thereof.

Industrial Applicability

When the Al composition of the AlGaN cladding layer in the laser diode structure is increased in order to enhance confinement of light in the active layer, AlGaN on the c-plane primary surface of hexagonal GaN cracks. When the InGaN optical guiding layer is grown with high In composition and over the critical thickness of InGaN, the surface of the epitaxial film is made blackish.

Particularly, in production of light emitting devices of long and short wavelengths, large difference in the lattice constant between the active layer and the GaN substrate is used. Hence, the active layer incorporates high built-in strain, so that the emission efficiency becomes lowered.

Since there is no suitable slip plane for relaxation of strain on the c-plane of GaN, the InGaN active layer results in incorporation of high strain and thus the AlGaN cladding layer cracks.

As the semiconductor regions exhibiting semipolar character and nonpolar character, it is possible to use an m-plane, an a-plane, an nonpolar plane rotated about the c-axis, or a semipolar plane inclined at 10 degrees or more from the c-plane toward the m-plane or the a-plane. When epitaxial growth is carried out on these nonpolar planes, a slip plane is created in an epitaxial film. For this reason, part or all of strain can be released by introduction of dislocations and it is thus feasible to prevent cracking of the AlGaN cladding layer of high Al composition and to perform film formation without occurrence of blackening of InGaN of high In composition.

By providing the lattice-relaxed semiconductor layer between the substrate and the active layer, the lattice constant of the underlying semiconductor layer below the active layer can be made closer to that of the active layer. In this case, the structure allowing reduction in strain of the active layer can be produced.

On an nonpolar plane and a semipolar plane, it is easy to generate a slip plane on the occasion of production of a heterojunction and dislocations are likely to be introduced. By making use of this introduction, the strain of the semiconductor layer can be relaxed by controlled introduction of dislocations, which allows growth of crack-free AlGaN with high Al composition and InGaN with high In composition.

LIST OF REFERENCE SIGNS

10 ... reaction reactor;
R1 ... reference plane;
11, 11a, 11b ... Group III nitride semiconductor laser diode (laser diode);
13 ... semiconductor region;
13a ... primary surface of semiconductor region;
15 ... first conductivity type cladding layer;
17 ... core semiconductor region;
19 ... first optical guiding layer;
21 ... active layer;
23 ... carrier blocking layer;
Ax ... normal axis;
VC13, VC19, VC29 ... c-axis vectors;
25 ... quantum well structure;
25a ... semiconductor layers (well layers);
25b ... barrier layers;
27a, 27b ... interfaces;
29 ... second conductivity type cladding layer;
31, 33, 35 ... second optical guiding layer;
37 ... second conductivity type contact layer;
39 ... insulating layer;
41, 45 ... electrodes;
LVC1-LVC7 ... lattice vectors;
$V1_L$-$V7_L$ ... longitudinal components;
$V1_T$-$V7_T$ ... transverse components;
43 ... support body;
43a ... nonpolar or semipolar primary surface;
50a, 50b, 50c ... junctions;
51 ... gallium nitride (GaN) substrate;
53 ... gallium nitride based semiconductor layer (n-type cladding layer);
55 ... first optical guiding layer;
57 ... active layer;
59 ... carrier blocking layer;
61 ... optical guiding layer;
63 ... second conductivity type (p-type cladding layer) gallium nitride based semiconductor layer;
65 ... p-type contact layer.

The invention claimed is:

1. A Group III nitride semiconductor laser diode comprising:
a first conductivity type cladding layer provided on a primary surface of a semiconductor region, the semiconductor region comprising a first hexagonal Group III nitride semiconductor, and the first conductivity type cladding layer comprising a second hexagonal Group III nitride semiconductor;
a first optical guiding layer provided on the first conductivity type cladding layer and comprising a third hexagonal Group III nitride semiconductor;
a carrier blocking layer comprising a fourth hexagonal Group III nitride semiconductor; and
an active layer provided between the first conductivity type cladding layer and the carrier blocking layer,
the primary surface of the semiconductor region making an angle of not less than 10 degrees with respect to a reference plane perpendicular to a c-axis of the first hexagonal Group III nitride semiconductor,
the first conductivity type cladding layer being lattice-relaxed on the primary surface of the semiconductor region,
the first conductivity type cladding layer, the first optical guiding layer, the active layer, and
the carrier blocking layer being arranged in a direction of a normal axis to the primary surface of the semiconductor region,
the carrier blocking layer incorporating strain, the active layer comprising a semiconductor layer, and the semiconductor layer incorporating strain,
the first optical guiding layer being lattice-relaxed on a primary surface of the first conductivity type cladding layer, and
the primary surface of the semiconductor region having either of nonpolar character or semipolar character,
wherein a direction of a c-axis in the first hexagonal Group III nitride semiconductor and a magnitude of a lattice constant d1 in the direction of the c-axis of the first hexagonal Group III nitride semiconductor are represented by a lattice vector LVC1,
wherein a direction of a c-axis in the second hexagonal Group III nitride semiconductor and a magnitude of a lattice constant d2 in the direction of the c-axis of the second hexagonal Group III nitride semiconductor are represented by a lattice vector LVC2, wherein the lattice vector LVC1 includes a longitudinal component $V1_L$ in the direction of the normal axis and a transverse component $V1_T$ perpendicular to the longitudinal component, wherein the lattice vector LVC2 includes a longitudinal component $V2_L$ in the direction of the normal axis and a transverse component $V2_T$ perpendicular to the longitudinal component, and wherein the transverse component $V1_T$ is different from the transverse component $V2_T$.

2. The Group III nitride semiconductor laser diode according to claim 1, wherein a direction of a c-axis of the third hexagonal Group III nitride semiconductor and a magnitude of a lattice constant d3 in the direction of the c-axis of the third hexagonal Group III nitride semiconductor are represented by a lattice vector LVC3, wherein the lattice vector LVC3 includes a longitudinal component $V3_L$ in the direction of the normal axis and a transverse component $V3_T$ perpendicular to the longitudinal component, and wherein the transverse component $V2_T$ is different from the transverse component $V3_T$.

3. The Group III nitride semiconductor laser diode according to claim 1, further comprising a second conductivity type cladding layer provided on the carrier blocking layer and comprising a fifth hexagonal Group III nitride semiconductor, wherein the carrier blocking layer is provided between the second conductivity type cladding layer and the active layer, wherein the fifth hexagonal Group III nitride semiconductor is different from the third hexagonal Group III nitride semiconductor, and wherein the second conductivity type cladding layer is lattice-relaxed.

4. The Group III nitride semiconductor laser diode according to claim 3, further comprising a second optical guiding layer provided between the second conductivity type cladding layer and the active layer, the second optical guiding layer comprising a sixth hexagonal Group III nitride semiconductor, wherein the lattice relaxation of the second conductivity type cladding layer takes place on the second optical guiding layer.

5. The Group III nitride semiconductor laser diode according to claim 3, wherein the second conductivity type cladding layer comprises $In_{X2}Al_{Y2}Ga_{1-X2-Y2}N$ ($0 \leq X2 \leq 0.50$, $0 \leq Y2 \leq 0.50$).

6. The Group III nitride semiconductor laser diode according to claim 3, wherein a thickness of the second conductivity type cladding layer is not less than 300 nm.

7. The Group III nitride semiconductor laser diode according to claim 1, wherein the first conductivity type cladding layer comprises $In_{X1}Al_{Y1}Ga_{1-X1-Y1}N$ ($0 \leq X1 \leq 0.50$, $0 \leq Y1 \leq 0.50$).

8. The Group III nitride semiconductor laser diode according to claim 1, wherein a thickness of the first conductivity type cladding layer is not less than 300 nm.

9. The Group III nitride semiconductor laser diode according to claim 1, wherein the active layer comprises $In_U Al_V Ga_{1-U-V}N$ ($0 \leq U \leq 0.50$, $0 \leq V \leq 0.50$).

10. The Group III nitride semiconductor laser diode according to claim 1, wherein an emission wavelength of the active layer is not less than 250 nm and not more than 600 nm.

11. The Group III nitride semiconductor laser diode according to claim 1, wherein the first optical guiding layer comprises $In_S Al_T Ga_{1-S-T}N$ ($0 \leq S \leq 0.30$, $0 \leq T \leq 0.30$).

12. The Group III nitride semiconductor laser diode according to claim 1, wherein a sum of a thickness of the active layer and a thickness of the first optical guiding layer is not less than 300 nm.

13. The Group III nitride semiconductor laser diode according to claim 1, wherein dislocations at an interface between the first conductivity type cladding layer and the first optical guiding layer have a density of not less than $1 \times 10^8$ cm$^{-2}$.

14. The Group III nitride semiconductor laser diode according to claim 13, wherein the dislocations include components of edge dislocations.

15. The Group III nitride semiconductor laser diode according to claim 1, further comprising a support body having a primary surface, the primary surface having either of nonpolar character or semipolar character, wherein the first conductivity type cladding layer is provided on the primary surface of the support body, and wherein the primary surface of the support body provides the primary surface of the semiconductor region comprising the first hexagonal Group III nitride semiconductor.

16. The Group III nitride semiconductor laser diode according to claim 15, wherein the support body comprises $Al_Z Ga_{1-Z}N$ ($0 \leq Z \leq 1$).

17. The Group III nitride semiconductor laser diode according to claim 15, wherein the support body comprises GaN.

18. A method for fabricating a Group III nitride semiconductor laser diode, comprising the steps of:

growing a first conductivity type cladding layer on a primary surface of a semiconductor region so that the first conductivity type cladding layer is lattice-relaxed, the semiconductor region comprising a first hexagonal Group III nitride semiconductor, and the first conductivity type cladding layer comprising a second hexagonal Group III nitride semiconductor;

growing a first optical guiding layer on the first conductivity type cladding layer so that the first optical guiding layer is lattice-relaxed, the first optical guiding layer comprising a third hexagonal Group III nitride semiconductor;

growing an active layer on the first optical guiding layer; and growing a carrier blocking layer on the active layer, the carrier blocking layer comprising a fourth hexagonal Group III nitride semiconductor, the primary surface of the semiconductor region making an angle of not less than 10 degrees with respect to a reference plane perpendicular to a c-axis of the first hexagonal Group III nitride semiconductor, the primary surface of the semiconductor region having either of nonpolar character and semipolar character, the carrier blocking layer incorporating strain, and the active layer comprising a semiconductor layer and the semiconductor layer incorporating strain, wherein the second conductivity type cladding layer comprises InAlGaN, and wherein a thickness of the second conductivity type cladding layer is larger than a critical thickness thereof in an aluminum composition and an indium composition of the fifth hexagonal Group III nitride semiconductor.

19. The method according to claim 18, further comprising the step of growing a second conductivity type cladding layer of a fifth hexagonal Group III nitride semiconductor on the carrier blocking layer so that the fifth hexagonal Group III nitride semiconductor of the second conductivity type cladding layer is lattice-relaxed, wherein the fifth hexagonal Group III nitride semiconductor is different from the third hexagonal Group III nitride semiconductor.

20. The method according to claim 19, further comprising the step of, prior to growth of the second conductivity type cladding layer, growing a second optical guiding layer on the active layer so that the second optical guiding layer is not lattice-relaxed, the second optical guiding layer comprising a sixth hexagonal Group III nitride semiconductor, wherein the lattice relaxation of the second conductivity type cladding layer takes place on the second optical guiding layer.

21. The method according to claim 20, wherein the second optical guiding layer comprises InGaN, and wherein a thickness of the second optical guiding layer is smaller than a critical thickness thereof in an indium composition of the sixth hexagonal Group III nitride semiconductor.

22. The method according to claim 18, wherein the first conductivity type cladding layer comprises InAlGaN, and wherein a thickness of the first conductivity type cladding layer is larger than a critical thickness thereof in an aluminum composition and an indium composition of the second hexagonal Group III nitride semiconductor.

23. The method according to claim 18, wherein the first optical guiding layer comprises InGaN, and wherein a thickness of the first optical guiding layer is larger than a critical thickness thereof in an indium composition of the third hexagonal Group III nitride semiconductor.

24. The method according to claim 18, further comprising the step of preparing a substrate with a primary surface, the primary surface having either of nonpolar character or semipolar character, the substrate comprising the first hexagonal Group III nitride semiconductor, wherein the primary surface of the semiconductor region is provided by either of nonpolar or semipolar primary surface, and wherein the substrate comprises any one of GaN, AlGaN, and AlN.

* * * * *